United States Patent
Sambasivan et al.

(10) Patent No.: US 7,208,196 B2
(45) Date of Patent: *Apr. 24, 2007

(54) EPITAXIAL OXIDE FILMS VIA NITRIDE CONVERSION

(75) Inventors: Sankar Sambasivan, Chicago, IL (US); Scott A. Barnett, Evanston, IL (US); Ilwon Kim, Skokie, IL (US); John Rechner, Wilmette, IL (US)

(73) Assignee: Applied Thin Films, Inc., Evanston, IL (US)

( * ) Notice: Subject to any disclaimer, the term of this patent is extended or adjusted under 35 U.S.C. 154(b) by 304 days.

This patent is subject to a terminal disclaimer.

(21) Appl. No.: 10/704,840

(22) Filed: Nov. 10, 2003

(65) Prior Publication Data

US 2004/0096587 A1    May 20, 2004

Related U.S. Application Data

(60) Division of application No. 09/931,588, filed on Aug. 16, 2001, now Pat. No. 6,645,639, which is a continuation-in-part of application No. 09/687,940, filed on Oct. 13, 2000, now Pat. No. 6,573,209.

(51) Int. Cl.
    *C23C 16/00* (2006.01)

(52) U.S. Cl. .................. 427/248.1; 427/255.29; 427/255.36; 427/331; 427/372.2

(58) Field of Classification Search .......... 117/90, 117/80, 95, 102, 106, 944; 427/248.1, 255.29, 427/255.36, 331, 372.2
See application file for complete search history.

(56) References Cited

U.S. PATENT DOCUMENTS 3,963,500 A    6/1976   Flowers et al.
4,303,732 A   12/1981   Torobin
4,336,338 A    6/1982   Downs et al.
4,450,184 A    5/1984   Longo et al.
4,671,909 A    6/1987   Torobin
5,017,523 A    5/1991   Kimura et al.
5,614,255 A    3/1997   Kimura et al.
5,713,974 A    2/1998   Martin et al.
5,833,728 A   11/1998   Kimura et al.
5,849,055 A   12/1998   Arai et al.
5,972,847 A * 10/1999   Feenstra et al. ............ 505/473
6,110,528 A    8/2000   Kimura et al.
6,210,715 B1   4/2001   Starling et al.
6,358,532 B2   3/2002   Starling et al.
6,554,948 B1   4/2003   Ferrier
6,692,678 B2   2/2004   Krowl et al.
6,852,160 B2 * 2/2005   Sambasivan et al. ......... 117/90
2002/0004111 A1 1/2002  Matsubara et al.
2004/0258601 A1 12/2004 Matsubara et al.

FOREIGN PATENT DOCUMENTS

GB    1 322 722    7/1973

(Continued)

OTHER PUBLICATIONS

Francis, Lorraine Falter, "Sol-Gel Methods for Oxide Coatings", Materials and Manufacturing Processes, vol. 12, No. 6, 963-1015, Copyright 1997 by Marcel Dekker, Inc.

(Continued)

*Primary Examiner*—Timothy Meeks
*Assistant Examiner*—Kelly Stouffer
(74) *Attorney, Agent, or Firm*—Reinhart, Boerner Van Deuren S.C.

(57) ABSTRACT

The present invention relates to oxides on suitable substrates, as converted from nitride precursors.

16 Claims, 31 Drawing Sheets

FOREIGN PATENT DOCUMENTS

| GB | 1 322 724 | 7/1973 |
|----|-----------|--------|
| GB | 1 322 726 | 7/1973 |
| GB | 1 451 145 | 9/1976 |
| WO | WO 2005/003033 A3 | 1/2005 |

OTHER PUBLICATIONS

Rothon, Roger N., "Novel, Low Curing Temperature, Glassy, Inorganic Coatings, Derived from Soluble Complexes of Aluminum and Other Metal Phosphates", Chemistry and Industry, Jun. 1, 1974, pp. 457-459.

Gugleilmi, Massimo, "Sol-Gel Coatings on Metals", Journal of Sol-Gel Science and Technology 8, 443-449 (1997), Copyright 1997 Kluwer Academic Publishers. Manufactured in The Netherlands.

Livage, J.; Barboux, P.; Vandenborre, M.T.; Schmutz, C.; Taulelle, F., "Sol-Gel Synthesis of Phosphates", Journal of Non-Crystalline Solids 147 & 148 (1992) 18-23, Elsevier Science Publishers B.V.

Lee, D.H.; Condrate, Sr., R.A.; Lacourse, W.C.; "FTIR Spectral Characterization of Thin Film Coatings of Oleic Acid on Glasses", Journal of Materails Science 35 (2000 4961-4970, Copyright 2000 Kluwer Academic Publishers.

Wilcox, David L.; Berg, Morris; "Microsphere Fabrication and Applications: An Overview", Mat. Res. Soc. Sump. Proc. vol. 372, Copyright 1995 Materials Research Society.

Moh, Kyung H.; "Sol-Gel Derived Ceramic Bubbles", Mat. Res. Soc. Symp. Proc. vol. 372, Copyright 1995 Materials Search Society.

Kim, Keykyoon (Kevin), "Fabrication of Glass and Micro- and Nanospheres from Liquid Precursors Using Droplet Generation and Sol-Gel Processing", Mat. Res. Soc. Symp. Proc. vol. 372, Copyright 1995 Materials Research Society.

Hagarman, James A.; "Hollow Borosilicate Microspheres from Aqueous Solution" Mat. Res. Soc. Symp. Proc. vol. 372, Copyright 1995 Materials Research Society.

Lui, Jay G.; Wilcox, Sr., David L.; "Design Guidelines and Water Extraction Synthesis Capabilities for Hollow Ceramic Microspheres for Low Dielectric Constant Inorganic Substrates", Mat. Res. Soc. Symp. Proc. vol. 372, Copyright 1995 Materials Research Society.

Japp, Robert M.; Papathomas, Kostas I.; "Low Dielectric Constant Laminates Containing Microspheres", Mat. Res. Soc. Symp. Proc. vol. 372, Copyright 1995 Materials Research Society.

Farooqui, M.M.; Evans, A.G.R.; "Solid and Hollow Micro and Spherical Structures in Polysilicon and Phosphosilicate Glass", Mat. Res. Soc. Symp. Proc. vol. 372, Copyright 1995 Materisl Research Society.

Japp, Robert M.; Papathomas, Kostas I.; "Low Dielectric Constant Laminates Containing Microspheres" Mat. Res. Soc. Symp. Proc. vol. 372, Copyright 1995 Materials Research Society.

Liu, Jay G.; Wilsox, Sr. David L.; "Design Guidelines and Water Extraction Synthesis Capabilities for Hollow Ceramic Microspheres for Low Dielectric Constant Inorganic Substrates", Mat. Res. Soc. Symp. Proc. vol. 371, Copyright 1995 Materials Research Society.

Kellerman, David W.; "Review of Low Dielectric Constant Thick Film Electronic Ceramics using Hollow Microspheres", Mat. Res. Soc. Symp. Proc. vol. 372, Copyright 1995 Materials Research Society.

Webpage at http://adt.lib.swin.ed.au/uploads/approved/adt-VSWT20031218.142251/public/03chapter2.pdf, "Chapter 2. Experimental"; Dec. 18, 2003.

3M, "3M Ceramic Microspheres, Paints and Coatings Applications Profile", 3M Performance Materials Division, 3M Center, Building 223-6S-04, St. Paul, MN 55144-1000, www.3m.com/paintsandcoatings, issued Nov. 2003, Copyright 2003 3M.

Kim, S.H.; Liu, B.Y.H.; Zachariah, M.R.; "Synthesis of Nanoporous Metal Oxide Particles by a New Inorganic Matrix Spray Pyrolysis Method", Chem. Matter, 2002, 14, 2889-2899, Copyright 2002 American Chemical Society, Published on Web Jun. 17, 2002.

Tan, Qui, "Spray Drying Dielectric Ceramics", www.ceramicsbulletin.org, Sep. 2004, CTS Communication Components, Inc., Albuquerque, NM.

Bertrand, G.; Roy, P.; Filiatre, C.; Coddet, C.; "Spray-Dried Ceramic Powders: A Quantitative Correlation Between Slurry Characteristics and Shapes of the Granules", Chemical Engineering Science 60 (2005) 95-102.

Moiseev, S.S.; Petrov, V.A.; Stepanov, S.V., "The Optical Properties of Heat-Insulating Ceramics Made of Microballoons of Aluminum Oxide", High Temperature vol. 41, No. 1, 2004, pp. 139-145, Copyright 2004 Russian Academy of Sciences and Kluwer.

Carlson, Krista; Webpage at ceer.alfred.edu/Research/Summer/carlsonreport.doc, "Production of Hollow Glass Microspheres from Amber Glass Frit".

Cochran, Joe K., "Ceramic Hollow Spheres and Their Applications", School of Materials Science and Engineering, Georgia Institute of Technology, Atlanta, GA 30332-0245, USA, Copyright Current Chemistry LTD ISSN 1359-0286.

Lima, R.S.; Marple, B.R.; "From APS to HVOF Spraying of Conventional and Nanostructured Titania Feedstock Powders: A Study on the Enhancement of the Mechanical Properties", Surface & Coatings (2004) Copyright 2004 Elsevier B.V.

Bertling, Jurgen; Blumer, Jan; Kummel, Rolf, "Hollow Microspheres", Chem. Eng. Technol. 2004, 27, No. 28, Copyright 2004 Wiley-VCH Verlag GmbH & Co. KGaA, Weinheim.

Dombrovsky, L.A.; "Approximate Models of Radiation Scattering in Hollow-Microsphere Ceramics", High Temperature, vol. 42, No. 5, pp. 776-784, Copyright 2004 Russian Academy of Sciences and Springer Science.

"Outline of Impact Blasting", Copyright PII 1990.

Sepvolgyi, J.; Karoly, Z., "Preparation of Hollow Alumina Microspheres by RF Thermal Plasma", Key Engineering Materials, vols. 264-268 (2004) pp. 101-104, Copyright 2004 Trans Tech Publications, Switzerland.

Shabde, V.S.; Mann, U.; Hoo, K.A.; "Numerical Solution of a Model Associated with the Production of Hollow Micro-particles", Department of Chemical Engineering, Texas Tech University, Lubbock, TX 79409, 2004 AIChE National meeting, Session 169, Paper 1691.

Lange, S.; Schweiger, G.; "Thermal Radiation from Spherical Microparticles: A New Dipole Model", 2444 J. Opt. Soc. Am. B/vol. 11, No. 12/Dec. 1994, Copyright 1994 Optical Society of America.

Orel, Zorica Crnjak; Gunde, Marta Klanjsek; "Spectrally Selective Paint Coatings: Preparation and Characterization", Solor Energy Materials & Solar Cells 68 (2001) 337-353; Copyright 2001 Elsevier Science B.V.

Lima, R.S.; Marple, B.R.; "Near-Isotropic Air Plasma Sprayed Titania", Acta Materialia 52 (2004) 1163-1170, Published by Elsevier Ltd on behalf of Acta Materialia Inc.

Luo, P.; Nieh, T.G.; "Preparing Hydroxyapatite Powders with Controlled Morphology", Biomaterials 17 (1996) 1959-1964, Copyright 1996 Elsevier Science Limited.

Baillis, Dominique; Sacadura, Jean-Francois; "Thermal Radiation Properties of Dispersed Media: Theoretical Prediction and Experimental Characterization", Journal of Quantative Spectroscopy & Radiative Transfer 67 (2000) 327-363, Copyright 2000 Elsevier Science Ltd.

Conduct-O-Fil Conductive Additives, "Conduct-O-Fil Silver-Coated Hollow Glass Spheres", Potters Industries, Inc., an Affiliate of PQ Corporation, Valley Force, PA 19482-0840.

Ding, Xuefend; Yu, Kaifeng; Jiang, Yanqiu; Zhang, Hari-Bala Hengbin; Wang, Zichen; "A Novel Approach to the Synthesis of Hollow Silica Nanoparticles", Materials Letters 58 (2004) 3618-3621, Copyright 2004 Elsevier B.V.

Dombovsky, L.A.; "Modeling of Thermal Radiation of Polymer Coating Containing Hollow Microspheres", High Temperature, vol. 34, No. 2, 2005, pp. 247-258, Copyright 2005 Russian Academy of Sciences and Springer Science.

Sizgek, E.; Bartlett, J.R.; "Production of Titanate Microspheres by Sol-Gel and Spray-Drying", Journal of Sol-Gel Science and Technology 13, 1011-1016 (1998), Copyright 1998 Kluwer Academic Publishers, Manufactured in The Netherlands.

\* cited by examiner

EPITAXIAL OXIDE FILMS VIA NITRIDE CONVERSION

The present invention is a divisional application of and claims priority benefit from application Ser. No. 09/931,588 filed on Aug. 16, 2001, issued as U.S. Pat. No. 6,645,639 on Nov. 11, 2003, which is hereby incorporated by reference and which is in turn a continuation-in-part of application Ser. No. 09/687,940 filed on Oct. 13, 2000, now issued U.S. Pat. No. 6,573,209, which claims priority benefit therefrom.

CROSS-REFERENCE TO RELATED APPLICATIONS

The following relate to the present invention and are hereby incorporated by reference in their entirety: U.S. Pat. No. 5,739,086 Structures Having Enhanced Biaxial Texture and Method of Fabricating Same by Goyal et al., issued Apr. 14, 1998; U.S. Pat. No. 5,741,377 Structures Having Enhanced Biaxial Texture and Method of Fabricating Same by Goyal et al., issued Apr. 21, 1998; U.S. Pat. No. 5,898,020 Structures Having Biaxial Texture and Method of Fabricating Same by Goyal et al., issued Apr. 27, 1999; U.S. Pat. No. 5,958,599 Structures Having Enhanced Biaxial Texture by Goyal et al., issued Sep. 28, 1999; U.S. Pat. No. 5,964,966 Method of Forming Biaxially Textured Substrates and Devices Thereon by Goyal et al., issued Oct. 21, 1999; and U.S. Pat. No. 5,968,877; High Tc YBCO Superconductor Deposited on Biaxially Textured Ni Substrate by Budai et al., issued Oct. 19, 1999,; U.S. Pat. No. 4,428,811 Rapid rate reactive sputtering of a group IVb metal by Sproul et al., issued Jan. 31, 1984;

FIELD OF THE INVENTION

The present invention relates generally to epitaxial metal oxide films and, more particularly, to those films and related composite structures as can be prepared by oxidizing a previously deposited nitride layer.

BACKGROUND OF THE INVENTION

Recent emergence of high-temperature superconducting (HTS) thick-film tape technology is expected to meet the cost, size and performance requirements of superconducting components needed for advanced power applications for the defense and commercial sectors. One of the major potential HTS applications is in the electric power industry.

The $YBa_2Cu_3O_7$ and related ceramic materials (YBCO) have appropriate intrinsic properties in the liquid nitrogen temperature range. However, their properties are drastically affected by grain boundary misorientations. In order to provide high temperature and field applications, it is imperative that a biaxially textured, polycrystalline YBCO tape, or related article, be developed which contains few high angle grain boundaries.

A biaxially textured, flexible metal/alloy substrate is formed by conventional thermomechanical processing followed by epitaxial deposition of buffer layer(s), YBCO grown on such substrate often exhibited $J_c$'s over 1 $MA/cm^2$ at 77K. To date, the preferred buffer layers have been the combination of $CeO_2$ and yttria stabilized zirconia (YSZ). However, these oxide buffer layers lack important properties, e.g., electrical and thermal conductivity and mechanical toughness. It has been a challenging engineering task to develop a large-scale continuous process for producing thick (>0.5 μm) crack-and pore-free oxide films. Microcracking in oxide films is commonly observed in thick films due to the brittle nature of the oxide materials. Microcracks in the oxide layer can serve as open paths for oxygen to diffuse and oxidize the underlying metal during subsequent YBCO processing. Finally, the oxide deposition step on the Ni substrates is difficult; high quality films are only obtained by using very low deposition rates. In addition, as with many HTS applications, conductive buffer layers are needed since they would provide electrical coupling of the HTS layer to the underlying metallic tape substrate. This is an important property in order to electrically stabilize the conductor during transient loss of superconductivity in some applications.

Conventional ceramic fabrication methods which can be used to make a long, flexible conductor result in materials with weak, if any, macroscopic or microscopic biaxial texture. In particular, YBCO materials fabricated using conventional techniques invariably contain numerous high angle grain boundaries. High angle grain boundaries act as Josephson coupled weak-links leading to a significant field-dependent suppression of the supercurrent across the boundary. For clean stoichiometric boundaries, the grain boundary critical current density depends primarily on the grain boundary misorientation. The dependence of $J_c(gb)$ on misorientation angle was first determined by Dimos et al. in YBCO for grain boundary types that can be formed in epitaxial films on bicrystal substrates. These include [001] tilt, [100] tilt, and [100] twist boundaries. In each case high angle boundaries were found to be weak-linked. The low $J_c$ observed in randomly oriented polycrystalline HTS fabricated using conventional methods can be understood on the basis that the population of tow angle boundaries is small and that frequent high angle boundaries impede long-range current flow. Hence, controlling the grain boundary misorientation distribution towards low angles is key to fabricating high-$J_c$ materials.

Successful fabrication of biaxially textured superconducting wire based on the coated conductor technology, requires optimization of the cost/performance of the HTS conductor. From a superconducting performance standpoint, a long, flexible, single crystal-like wire is required. From a cost and fabrication standpoint, an industrially scalable, low cost process is required. Both of these critical requirements are met by Rolling-assisted-biaxially-textured-substrates. However, in order for cost/performance for a conductor based on this technology to be optimized, further work needs to be done in the area of buffer layer technology. It is now clear that while it is fairly straight-forward to fabricate long lengths of biaxially textured metals or alloys, it is quite difficult to deposit high quality buffer layers using low cost processes. Requirements of buffer layers include—it should provide an effective chemical barrier for diffusion of deleterious elements from the metal to the superconductor, provide a good structural transition to the superconductor, have a high degree of crystallinity, excellent epitaxy with the biaxially textured metal template, have good mechanical properties, high electrical and thermal conductivity and should be able to be deposited at high rates.

Buffer layers of the prior art include use of YSZ and $CeO_2$, typically a configuration of $CeO_2$ (0.01 μm)/YSZ (0.5 μm)/$CeO_2$ (0.01 μm). The purpose of the first buffer layer is to provide a good epitaxial oxide layer on the reactive, biaxially textured Ni substrate without the formation of undesirable NiO. $CeO_2$ is special in its ability to very readily form single orientation cube-on-cube epitaxy on cube textured Ni. Deposition of $CeO_2$ using a range of deposition techniques is done using a background of forming gas (4%

$H_2$–96% Ar) in the presence of small amounts of water vapor. Under such conditions the formation of NiO is thermodynamically unfavorable while the formation of $CeO_2$ is thermodynamically favorable. The water vapor provides the necessary oxygen to form stoichiometric $CeO_2$. It is not possible to deposit YSZ under such conditions with no evidence of undesirable orientations. In the case of $CeO_2$ one can readily obtain a single orientation, sharp cube texture. Ideally, it would be desired that the $CeO_2$ layer be grown thick such that it also provides a chemical diffusion barrier from Ni, followed by deposition of YBCO. However, when the $CeO_2$ layer is grown greater than 0.2 µm in thickness, it readily forms micro-cracks. Hence, an YSZ that does provide an excellent chemical barrier to diffusion of Ni and does not crack when grown thick is deposited on a thin initial template of $CeO_2$. However, since there is a significant lattice mismatch between YSZ and YBCO (~5%), a second 45°-rotated orientation nucleates at times. In order to avoid the nucleation of this second orientation completely, a thin $CeO_2$ layer is typically deposited epitaxially on the YSZ layer, to complete the buffer layer structure. YBCO can now be deposited on the layer that has an excellent lattice match with YBCO (~0.1%).

The drawbacks of this buffer layer structure are that the deposition of the first $CeO_2$ layer is non-trivial. Strict control of deposition conditions in particular, the $O_2$ partial pressure is required to avoid formation of undesirable NiO (NiO typically nucleates in mixed orientations and is also very brittle). Furthermore, $CeO_2$ can have wide range of oxygen stoichiometries. It is brittle and is not conducting. It will be a challenging engineering task to develop a large-scale continuous process for producing thick (>0.5 µm) crack-and porosity-free oxide films. For example, in a continuous process involving reactive electron beam evaporation of Ce to form $CeO_2$, issues relating to the formation of an oxide on the target complicate matters relating to rate of deposition as well as stability of the melt pool. Any change of conditions during deposition is known to have profound affects on the film microstructure. Moreover, any oxidation of the biaxially textured metal, even after the successful deposition of $CeO_2$, can induce undesirable interfacial stresses leading to spallation or further cracking, thus deteriorating the material properties. Microcracks in the oxide buffer layer will adversely affect the epitaxial quality of the growing YBCO film and create weak-links, besides serving as diffusion paths for Ni. Lastly, the surface morphology of the buffer layer is important for subsequent YBCO growth. Ideally, it would be desired to have a buffer layer which tends to be smoother than the Ni substrate it is grown on. All things considered, buffer layer deposition of the prior art is time-consuming and qualitatively deficient.

It has been an on-going concern in the art to meet the increasing demands for improved performance and miniaturization in next generation of electronic devices and components. New and advanced materials—primarily in the form of thin films—will be required. Deposition of oxide thin films is being pursued for a number of electronic applications including microelectronics (memory and microprocessing), sensors, fuel cells, superconductors, photonics, and other specialty markets. Oxide films provide protection against chemical attack, electrical and thermal insulation, and suitable dielectric properties, etc. However, as mentioned above, primary technical barriers in processing of oxide films include low deposition rates, poor film quality, and oxidation of substrate surfaces during deposition.

One approach to the aforementioned concerns has been to deposit alternate materials on the substrate to alleviate the mechanical deficiencies of the prior art oxides. Such materials are more robust, but often exhibit a lattice mismatch significantly detrimental to later deposition of a functional electromagnetic layer. Invariably, this and related difficulties are addressed with use of one or more suitable oxide layers. However, many of the aforementioned problems inherent to oxide films—slow deposition rates and micro-cracking, among them—remain and impede efficient, cost-effective buffer formation and device fabrication.

To illustrate, consider Lee, et al., *Formation and Characterization of Epitaxial $TiO_2$ and $BaTiO_3/TiO_2$ Films on Si Substrate*. Jpn. J. Appl. Phys. Vol. 24, Pt. 1, No. 2B (February, 1995). Titanium dioxide thin films are described as converted from a nitride precursor. However, the resulting oxide is not biaxially textured; it is epitaxial out of plane but not in plane as would be necessary for superconducting applications. Biaxial texture can be defined in the context of superconducting applications as having a full-width—half-maximum (FWHM) less than about 15°, and preferably below 10°, for both in-plane and out of plane orientations. Further, the Lee films are described as having a rutile phase, presumably without an epitaxial lattice match as evidenced by x-ray results. The films are rough and porous, and exhibit high leakage and poor dielectric properties. Even so, there is no indication that this system could be extended, if desired, to deposit other materials on substrates more suitable to superconductor applications.

The foregoing background information, together with other aspects of the prior art, are disclosed more fully and better understood in light of the following publications:

1. Kormann, G., Bilde, J. B., Sorensen, K., de Reus, R., Anderson R. H., Vace, P., and Freltoft, T., "Relation between Critical Current Densities and epitaxy of Y-123 Thin Films on MgO (100) and $SrTiO_3$ (100)," *J. Appl. Phys.*, 1992, 71, 3419–3426.
2. Matsuda, H., Soeta, A., Doi, T., Aikhara, and T. Kamo, "Magnetization and Anisotropy in Single Crystals of Tl-1223 of Tl—Sr—Ca—Cu—O System," *Jpn. J. Appl. Phys.*, 1992, 31, L1229–31.
3. Dimos, D., Chaudhari, P., Mannhart, J., and F. K. LeGoues, "Orientation Dependence of Grain Boundary Critical Currents in $YBa_2Cu_3O_x$ Bicrystals", Phys. Rev. Lett., 1988, 61, 219–222; Dimos, D., Chaudhari, P., and Mannhart, J., "Superconducting Transport Properties of Grain-boundaries in $YBa_2Cu_3O_x$ Bicrystals", *Phys. Rev. B,* 1990, 41, 4038–4049.
4. Iijima, Y., Tanabe, N., Kohno, O., and Ikeno, Y., "In-plane Aligned $YBa_2Cu_3O_x$ Thin-Films Deposited on Polycrystalline Metallic Substrates", *Appl. Phys. Lett.,* 1992, 60, 769–771.
5. Reade, R. P., Burdahl, P., Russo, R. E., and Garrison, S. M., "Laser Deposition of Biaxially Textured Yttria-stabilized Zirconia Buffer Layers on Polycrystalline Metallic Alloys for High Critical Current Y—Ba—Cu—O Thin-films", *Appl. Phys. Lett.,* 61, 2231–2233, 1992.
6. Wu, X. D., Foltyn, S. R., Arendt, P. N., Blumenthal, W. R., Campbell, I. H., Cotton, J. D., Coulter, J. Y., Hults, W. L., Maley, M. P., Safar, H. F., and Smith, J. L., "Properties of $YBa_2Cu_3O_x$ Thick Films on Flexible Buffered Metallic Substrates", *Appl. Phys. Lett.,* 1995, 67, 2397.
7. Hasegawa, K., Fujino, K., Mukai, H., Konishi, M., Hayashi, K., Sato, K., Honjo, S., Satao, Y., Ishii, H., and Iwata, Y., "Biaxially Aligned YBCO Film Tapes Fabricated by All Pulsed Laser Deposition", *Appl. Supercond.,* 4, 475–486, 1996.

8. Goyal, A., Norton, D. P., Christen, D. K., Specht, E. D., Paranthaman, M., Kroeger, D. M., D. P., Budai, J. D., He, Q., List, F. A., Feenstra, R., Kerchner, H. R., Lee, D. F., Hatfield, E., Martin, P. M., Mathis, J., and Park, C., "Epitaxial Superconductors on Rolling-Assisted-Biaxially-Textured-Substrates (RABiTS): A Route Towards high Critical Current Density Wire", *Applied Supercond.*, 1996, 69, 403–427.; A. Goyal et al., U.S. Pat. No. 5,739,086 and U.S. Pat. No. 5,741,377.

9. Norton, D. P., Goyal, A., Budai, J. D., Christen, D. K., Kroeger, D. M., Specht, E. D., He, Q., Saffian, B., Paranthaman, M., Klabunde, C. E., Lee, D. F., Sales, B. C., and List, F. A., "Epitaxial $YBa_2Cu_3O_x$ on Biaxially Textured Nickel (100): An Approach to Superconducting Tapes with High Critical current Density", *Science,* 1996, 274, 755.

10. Goyal, A., Norton, D. P., Kroeger, D. M., Christen, D. K., Paranthaman, M., Specht, E. D., Budai, J. D., He, Q., Saffian, B., List, F. A., Lee, D. F., Hatfield, E., Martin, P. M., Klabunde, C. E., Mathis, J., and Park, C., "Conductors With Controlled Grain Boundaries: An Approach To The Next Generation, High Temperature Superconducting Wire", *J. Mater. Res.*, 1997, 12, 2924–2940.

11. Goyal, A., Norton, D. P., Budai, J. D., Paranthaman, M., Specht, E. D., Kroeger, D. M., Christen, D. K., He, Q., Saffian, B., List, F. A., Lee, D. F., Martin, P. M., Klabunde, C. E., Hatfield, E., and Sikka, V. K., "High Critical Current Density Superconducting Tapes By Epitaxial Deposition of $YBa_2Cu_3O_x$ Thick Films on Biaxially Textured Metals", *Appl. Phys. Lett.*, 1996, 69, 1795.

12. W. D. Sproul, "Physics and Chemistry of Protective Coatings", Ed. by W. D. Sproul, J. E. Greene, and J. A. Thornton (AIP Conf. Proc. No. 149, 1986, New York), p. 157.

OBJECTS OF THE INVENTION

There are numerous problems related to the prior art as pertains to the use and deposition of oxide layers on metal/alloy substrates. Thus there is a need for a new approach to buffer configuration and incorporation of various oxide materials. There is also a corresponding need for the fabrication of such materials/layers at high rates without premature substrate oxidation. Accordingly, it is one object of the present invention to provide a new, commercially-viable and easily scalable method for the high-rate formation of epitaxial oxide layers. It will be understood by those skilled in the art that one or more aspects of this invention can meet certain objectives, while one or more other aspects can meet certain other objectives. Each objective may not apply equally, in all instances, to every aspect of the present invention. As such, the present objects can be viewed in the alternative with respect to any one aspect of the present invention.

It is another object of the invention to provide an epitaxial nitride layer and, thereafter, the nitride layer converted to an epitaxial oxide layer.

It is yet another object of the invention to provide a method for obtaining good quality epitaxial oxides without premature substrate oxidation.

It is yet another object of the present invention to provide for the use of the epitaxial oxide layers converted from epitaxial nitride layers as templates to grow epitaxial metal/alloy/ceramic and/or device layers.

It is yet another object of this invention to provide an epitaxial nitride layer and methods for subsequent conversion thereof to an oxide providing a sufficient lattice match for later deposition of a functional electromagnetic layer. More specifically, it can also be an object of this invention, alone or in conjunction with other such objects, to provide one or more oxide layers having cubic crystalline morphology with an epitaxy sufficient for subsequent deposition of a functional electromagnetic material. Such objects can also be achieved through use of the present invention in conjunction with substrates suitably textured for functional applications of the sort described herein.

It is yet another object of the present invention to provide for the use of a nitride as a protective layer on a metal or alloy or ceramic substrate whereby long lengths of metal tape or wire can be spooled or otherwise configured until it is converted to an epitaxial oxide, partially or entirely just prior to subsequent oxide layer growth.

It is yet another object of the present invention to provide a method for the fabrication of oxide thin films on or in conjunction with suitable substrates, such films as can be used as part of a composite in a variety of electronic devices, including but not limited to superconducting tapes and/or wires.

Other objects, features, benefits and advantages of the present invention will be apparent from the foregoing in light of the following summary and descriptions, and will be readily apparent to those skilled in the art have a knowledge of various buffer layers, composites, articles and their methods of manufacture. Such objects, features, benefits and advantages will be apparent from the above as taken in conjunction with the accompanying examples, figures, tables, data and all reasonable inferences to be drawn therefrom.

SUMMARY OF THE INVENTION

In accordance with one aspect of the present invention, a method of preparing a epitaxial article is presented and includes providing a substrate, having a biaxial texture or a random orientation, having a surface and depositing onto the surface, in the presence of nitrogen gas, an epitaxial layer of a nitride; and further oxidizing the epitaxial nitride layer to form an epitaxial oxide layer in the presence of an oxidizing agent. The oxidation step can be performed either in-situ or can be annealed externally in oxidizing atmospheres.

In accordance with still a further aspect of the present invention, a method of preparing an epitaxial article includes providing a biaxially textured substrate having a surface and depositing onto the surface, an epitaxial layer of a nitride; and further oxidizing the epitaxial nitride layer to form an epitaxial oxide layer; and further depositing on the epitaxial oxide layer a second epitaxial layer of an oxide such as but not limited to MgO, $CeO_2$, YSZ, $BaPbO_3$, $LaAlO_3$, $SrTiO_3$, $LaNiO_3$, $Y_2O_3$, and/or $RE_2O_3$ (where RE is an acronym for any of the rare earth metals); and, optionally, further depositing on the oxide layer an additional electromagnetic/optical epitaxial device layer such as but not limited to a superconducting layer. Without limitation, reference is made to the results and data of Examples 15–16, below.

In accordance with another aspect of the present invention, epitaxial nitride layers can be deposited at high rates using a technique such as reactive magnetron sputtering with metal targets under nitrogen containing atmosphere, or magnetron sputtering with nitride targets. Reactive magnetron sputtering provides high deposition rates approaching those available using metal sputtering techniques.

In accordance with another aspect of the present invention, epitaxial nitride layers can be deposited on biaxially textured substrates by a multiple-deposition-temperature technique to accommodate the relatively large lattice match between the nitride and substrate. The initial deposition is done at lower temperature to suppress island growth while higher temperature is used for the rest of deposition.

In accordance with one aspect of the present invention, the foregoing and other objects can be illustrated with a biaxially textured article which includes a biaxially textured substrate having thereon an epitaxial layer of a novel nitride composition, a yttrium zirconium nitride (YZN).

In accordance with yet another aspect of the present invention, the foregoing and other objects can be demonstrated with a biaxially textured article which includes a biaxially textured substrate having thereon an epitaxial YSZ layer converted from YZN, having thereon, optionally, an epitaxial layer of an oxide such as but not limited to MgO, $CeO_2$, YSZ, $LaAlO_3$, $SrTiO_3$, $BaPbO_3$, $LaNiO_3$, $Y_2O_3$, and/or $RE_2O_3$, and as a further option an additional electromagnetic/optical, epitaxial device layer such as a superconducting layer.

In accordance with yet another aspect of the present invention, the foregoing and other objects can be met by a biaxially textured article or device which includes a biaxially textured substrate initially having thereon an epitaxial nitride layer, subsequently converted to an oxide such as but not limited to $CeO_2$, YSZ, $LaAlO_3$, $SrTiO_3$, $Y_2O_3$, and/or $RE_2O_3$, and as a further option including an additional electromagnetic/optical, epitaxial device layer such as a superconducting layer.

In part, the present invention is a method of preparing an oxide film, preferably, one that affords epitaxial coverage. The method includes (1) providing a substrate surface; (2) placing a nitride composition layer on the substrate surface, the nitride composition including but not limited to transition and rare earth metal compounds and combinations thereof; and (3) oxidizing the nitride composition to provide the desired oxide film. In preferred embodiments, the nitride composition is annealed. The conversion is at a time and temperature sufficient to provide complete oxidation of the nitride layer. However, as described elsewhere herein, conversion may be controlled so as to provide a partially-oxidized nitride layer, as may be desired for a particular end use application. Regardless, conversion can be accomplished using oxygen gas as the oxidizing agent, with the rate and extent of oxidation as can be controlled by the oxygen partial pressure. Other oxidizing agents can also be used according to straight-forward modifications of the preparatory techniques described herein, such agents including but not limited to water, ozone, a suitable peroxide, and metal-organic oxygen sources.

The nitride layers of this invention can be placed and/or deposited on a variety of suitable substrate materials, including biaxially-textured substrate or those metal and/or alloy materials without specific orientation. Such placement can be accomplished by processes well-known to those skilled in the art, using, in particular, those techniques described below or as can be ascertained from modification of the technologies set forth in the aforementioned incorporated references. For instance, for the reactive magnetron sputtering device, such as that schematically represented in FIG. 14, can be used with either nitride or carbide targets, or corresponding metal targets under a nitrogen containing atmosphere. Such devices and their operation, along with similar deposition techniques, are well-known, understood, and would be available to those individuals made aware of this invention. Epitaxial precursor placement and/or growth can be achieved sequentially over a temperature range, the bounds of which vary with the chemical identity of the precursor material. While a two temperature sequence is shown below, other multiple temperature increments can be used with comparable effects for precursors with or without solute/dopant additives.

As described below, nitride placement/deposition can be more time-efficient than those related methods of the prior art. Reactive sputtering of the type described herein, is a relatively rapid process, with rates that can approach about 1 μm/min through use of apparatus and equipment now available with straight-forward modifications as would be understood by those skilled in the art made aware of this invention. Such layers provide a buffer between the substrate material and electromagnetic layer or film subsequently deposited thereon. The nitride layers of this invention, prior to oxidation, are mechanically robust and have high electrical and thermal conductivities. Those mechanical properties can be exploited, as described more fully below. The associated conductivities provide good electrical and thermal contact, as would be required in a variety of integrated device applications. Such nitrides, and carbides, are available either commercially or synthetically as the corresponding transition, lanthanide and rare earth metal compounds or combinations thereof. Epitaxial substrate coverage can be obtained, as described below. Stoichiometric control allows tailoring of the nitride/carbide lattice parameters so as to provide a good buffer between the substrate and the desired electromagnetic/integrative layer.

Conversion of a precursor nitride composition to an oxide film can be, as described below, achieved in situ immediately after nitride deposition on the substrate surface. However, a unique advantage of this invention allows for whole or partial conversion at a time and place far removed from the point of nitride deposition. As described below, oxidation ex situ is possible given the beneficial structural properties exhibited by the nitride precursor. Such a composite, device or manufactured article can be configured for storage or shipment without compromising epitaxial coverage. The nitride can be oxidized just prior to subsequent fabrication, such as deposition of a superconducting or other such ceramic material en route to the desired integrated device. Reference is made to FIG. 16, the representative parameters provided therein, in conjunction with the following descriptions and examples.

Various embodiments of the present invention include multiple nitride layers, any one or all of which can be oxidized in situ depending upon a particular end use application. Any remaining nitride precursor can be oxidized ex situ. Even so, a preferred embodiment of this invention relates to deposition of one zirconium nitride composition, optionally including a solute or dopant at a concentration required to further enhance the stability of the resulting oxide structure. As with other embodiments, useful additives include yttrium nitride, as well as other such materials capable of forming a solid solution with the nitride. Regardless, the enhanced stability imparted by the solute permits, if necessary, later oxidation ex situ to provide an oxide film on which can be deposited additional material layers.

Implicit from the foregoing discussion, the present invention also includes use of a precursor composition to prepare an epitaxial oxide film. The method of preparation includes (1) deposition of an epitaxial precursor film on a substrate surface or another film or layer previously deposited on the substrate, with the precursor compositions including but not limited to transition and rare earth metal nitrides, carbides, and combinations thereof; and (2) conversion of the precursor composition to an epitaxial oxide film, with the thickness thereof as can be determined by parameters relating to conversion of the precursor composition. Where the precursor composition is deposited on a preexisting nitride or carbide layer,-subsequent conversion can also, alternatively, oxidize one or more of the preexisting layers. Partial oxidation can be useful, depending upon end use application, where the precursor material is a nitride composition. However, a carbide precursor typically requires complete conversion to the oxide for reasons relating to subsequent fabrication. For instance, residual carbon can contaminate and interfere with the function of a ceramic superconducting material applied thereafter.

As can be inferred from the foregoing, the present invention also includes a composite having a metal oxide layer on a metal substrate, with the oxide layer produced and/or obtainable from the oxidation of a metal nitride composition previously deposited on the substrate. The oxide layer can be characterized as having a substantially single epitaxial orientation. Preferred embodiments provide an oxide layer substantially without a nitride component; however, partial oxidation of the previously-deposited metal nitride can provide a residual nitride component, as demonstrated by one or more of the following examples. Regardless, such preferred metal oxides are stabilized with a dopant. In highly preferred embodiments, the composite includes a yttria stabilized zirconia composition on a biaxially textured metal/alloy substrate.

In part, the present invention also includes one or more functionally integrated devices, such devices having, without limitation, dielectric, refractory, ferro-electric, electro-optical, non-linear optical, field emission, photonic, waveguide, semi-conducting and/or super-conducting applications, such devices as could be fabricated using the present invention in conjunction with other techniques and components known to those skilled in the art. Such integrated devices include a composite structure having a substrate and at least one epitaxial nitride composition deposited thereon, with the nitride composition partially-oxidized as described elsewhere herein. In preferred embodiments, the composite also includes an electromagnetic film providing a desired functionality to the integrated device. In various preferred embodiments, the partially oxidized nitride composition is the reaction product of an yttrium zirconium nitride and a suitable oxidizing agent. The partial-oxidation characteristics of such a composition can be utilized and maintained under reducing conditions, such as would be utilized in the fabrication of a ferro-electric device.

In part, the present invention is also a configured composite including a substrate material, biaxially textured or having another suitable orientation, and at least one nitride layer thereon. In preferred embodiments, a nitride layer is epitaxial. Taking advantage of the mechanical stability afforded through use of such nitride buffer layers, the inventive composite can be arranged about an axis perpendicular to the configuration, such an arrangement as can be provided with the composite coiled around and about a spool. Such a configuration is possible through use of the nitride compositions described herein and allows for the storage, transportation and/or later fabrication of the subject composite.

Preferred embodiments of the composites, structures and/or devices described herein can include a novel composition of matter: a solid solution of zirconium nitride and yttrium nitride represented by the formula $(Zr_xY_{1-x})N$, where x is a value from about 0.1 to about 0.9. While various stoichiometries are available and can be used good effect, preferred solutions are those in which the value of x is about 0.6 to about 0.9.

As mentioned above, the present invention teaches a unique way to produce epitaxial oxide films via first depositing a nitride film at very high rates and then converting it into an oxide by a post annealing step under controlled partial pressure of oxidizing atmospheres. In one example of the present invention, YZN (as intimated above, YZN refers to ZrN doped with varying contents of YN) films with a molar ratio of Y(0.2)/Zr(0.8) can be developed then subsequently converted to YSZ containing 10 mole % yttria. The identification of a YZN composition suitable for conversion to YSZ is not trivial, because the solubility of YN with ZrN should provide a stable YZN composition. As is shown in one example of the present invention, YZN film with a molar ratio of 50% YN and 50% ZrN exhibited phase separation to YN and ZrN at relatively high growth temperature. The amount of yttrium (or yttria) in YSZ affects the stability of the cubic phase, and this invention includes a range of yttria concentrations required to achieve the desired YSZ phase stability. Stabilized cubic zirconia can also be formed with dopants/additives other than yttria, so long as those stabilizing elements are sufficiently soluble with the nitride precursor. Appropriate oxidation and/or conversion conditions are then employed to form YSZ epitaxially on YZN.

Without restriction to any one theory, mode or mechanism, it is thought that similar cubic symmetries together with a reasonably small lattice mismatch allow formation of an epitaxial oxide film on the nitride surface as nitrogen is released into the atmosphere and oxygen is incorporated in the compositional structure. Regardless, epitaxy is achieved at high rates without premature substrate oxidation.

BRIEF DESCRIPTION OF THE DRAWINGS

FIG. 1 inset also compares the rocking curve from YZN (200) and Ni (200), showing the FWHM of ~3.4° and 5.5° for YZN and Ni, respectively. Note that the FWHM of YZN is almost 2° smaller than that of Ni, indicating out-of-plane texture and smooth surface morphology substantially better than that of Ni.

FIG. 5 inset also compares the rocking curve from YSZ (200) and Ni (200), showing the FWHM of ~4.8° and ~5.5° for YSZ and Ni, respectively. FWHM of YZN is 0.7° smaller than that of Ni, indicating out-of-plane texture and smooth surface morphology better than that of Ni.

FIG. 25 inset also compares the rocking curve from YZN (200) and Ni—Cr (13%) (200), showing the FWHM of ~4.2° and 5.8°° for YZN and Ni—Cr (13%), respectively. FWHM of YZN is almost 2° smaller than that of Ni, indicating out-of-plane texture and smooth surface morphology substantially better than that of Ni.

DETAILED DESCRIPTION OF THE INVENTION

The present invention provides a new methodology for preparing epitaxial metal oxide layers from epitaxial nitride layers under controlled oxidation conditions. Epitaxial nitrides can be deposited at high rates on highly lattice mismatched biaxially textured metal substrates prior to oxidation. Accordingly, a new composition of matter, (ZrY)N, has also been developed that can be converted to YSZ.

As mentioned above, in deposition of epitaxial oxide layers for various applications, there are a number of problems due to premature oxidation of substrate. For example, initial oxide buffer layer deposition on biaxially textured Ni/Ni alloy substrate for YBCO superconductor devices are problematic due to NiO formation. Available techniques for epitaxial oxide layer growth on Ni/Ni-Alloy substrates are slow and difficult to control. Direct oxide deposition is only feasible by first depositing $CeO_2$ under reduced conditions prior to growth of a relatively thick YSZ layer. Thus, high quality epitaxial YSZ layers cannot be grown directly on these substrates. The present invention allows for formation of YSZ through conversion of YZN, thus avoiding an extra step of ceria deposition. While methods for producing biaxially textured substrates and subsequently depositing of YBCO were taught in previous U.S. Pat. Nos. 5,739,086, 5,741,377, 5,898,020, 5,958,599, 5,739,086, 5,741,377, 5,898,020, and 5,958,599, by Goyal et al., and U.S. Pat. No. 5,968,877 by Budai et al., these inventions did not teach the fabrication of scalable oxide buffer layers with high growth rates.

The present invention allows high rate formation of epitaxial oxides with high deposition rate and without the undesired oxidation of substrate. Because the oxidation proceeds in a direction from nitride/atmosphere interface toward nitride/substrate interface, epitaxy quality is not effected by substrate oxidation. Oxide thickness can be controlled because the conversion rate depends on the diffusion rate of oxygen (or progressive action of another such oxidizing agent).

The present invention also includes use of various other oxidizing agents—depending on the chemical properties of nitride, oxide and substrate—such agents including, but not limited to oxygen, water, ozone, suitable peroxide or metal-organic oxygen sources. For example, an epitaxial YZN layer was converted to epitaxial YSZ under high purity hydrogen atmosphere containing controlled amount of water. The oxygen partial pressure is dictated by and annealing temperature/water partial pressure and it can be controlled to be $<10^{-20}$ atmosphere. Ni substrates are resistant to oxidation under such conditions, but YZN oxidizes relatively quickly to YSZ, forming an epitaxial YSZ layer without substrate contamination.

Figure 3:
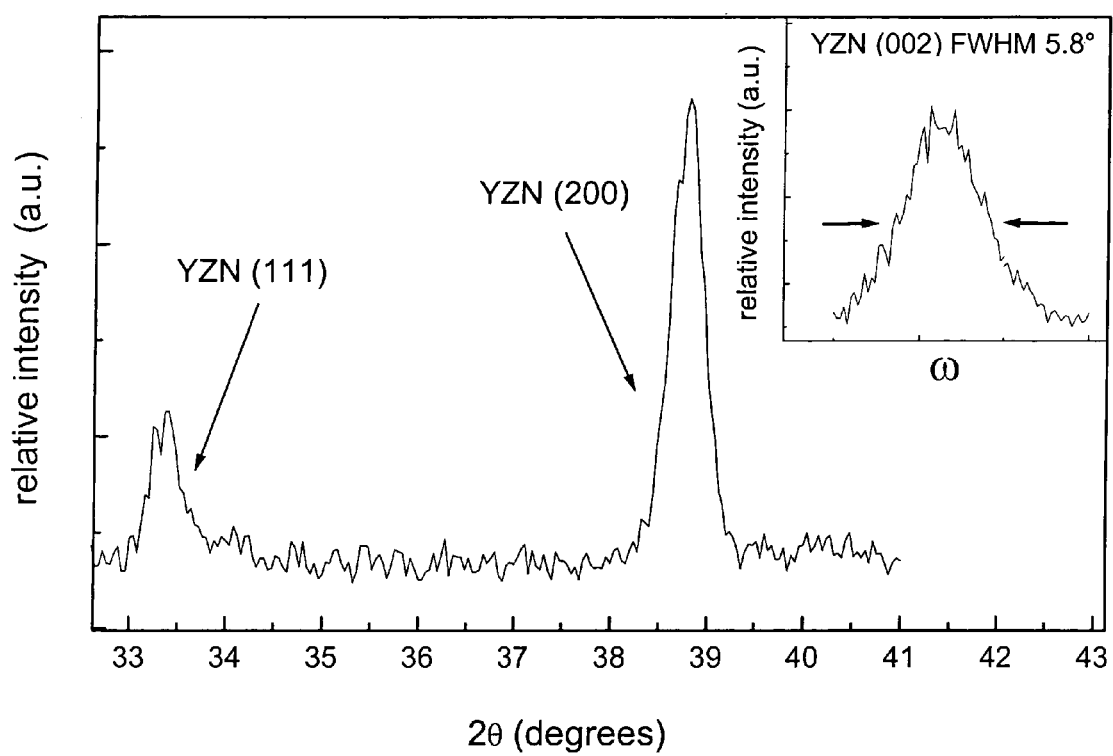
FIG. 3 shows XRD θ-2θ scan from 50 nm thick magnetron sputtered $Y_{0.2}Zr_{0.8}N$ (YZN) grown at constant temperature of ~550° C. The pattern shows an intense (200) peak but a small (111) peak. This indicates that while this sample has substantial out of plane texture in (200) direction, but is not epitaxial. The rocking curves (the out-of-plane texture) of the YZN layer was found to be ~5.8° in the rolling direction.
Figure 4:
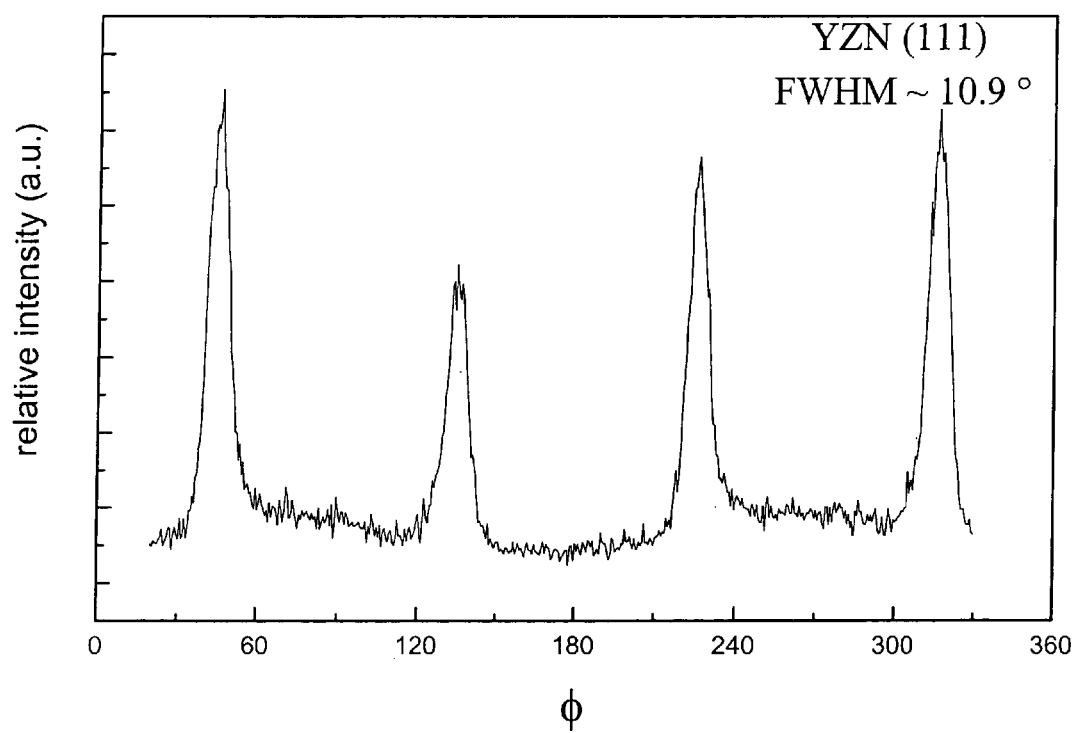
FIG. 4 shows the (111) phi-scan from same sample as in FIG. 1. The location of the peaks in the (111) phi scan are consistent with a cube-on-cube epitaxial relationship. The YZN (111) phi scan showed a full-width-half-maximum (FWHM) obtained by fitting a Gaussian curve to the data to be ~10.9°, indicating the grains that aligned to (200) orientation in out-of-plane direction also has some in-plane textures.

Another aspect of this invention is that upon oxidation, converted oxide shows no significant deterioration in biaxial texture compared to the precursor nitride film, even at high the rate of oxidation. As is shown in FIG. 4, the FWHM of (111) phi-scan from YSZ shows less than 1 degree difference from that of (111) phi-scan from YZN, indicating that the biaxial texture of YSZ is comparable to that of the precursor nitride, YZN, despite a 11% lattice mismatch. The out-of-plane rocking curve data of FIG. 5 for YSZ shows less than a degree difference compared to the rocking curve data for YZN in FIG. 3.

The present invention also provides a way of exploiting unique nitride properties to facilitate the related manufacturing processes. For example, manufacturing YBCO coated conductor wire requires multiple steps of spooling and winding, each of which poses mechanical stresses on the ceramic films or substrate. One can convert YZN to YSZ just prior to growth of YBCO, so that spooling/winding can be done with YZN on a substrate rather than the mechanically weaker YSZ. It is, therefore, possible and advantageous to avoid buffer cracking and spalling such that high quality functional films, such as YBCO, can be grown on YSZ.

Multiple layers of different nitrides can be deposited with high rates and converted to oxide sequentially, if such a configuration is required for a specific application—depending on structural, electro-magmentic/optical, mechanical or thermal properties of oxide and nitride. For example, a thin ZrN layer can be deposited on a substrate to improve the epitaxial quality/in-plane orientation of a YZN film deposited thereon. See, for instance, Example 15. As a further example, a thin epitaxial TiN layer can be first deposited on Ni substrate, rather than YZN, because it has smaller lattice mismatch with Ni (19%) than YZN (31%) and allows for more straightforward growth process. A thick YZN layer can then be deposited on TiN-coated Ni or other metal or metal alloy substrates, relatively easily due to the smaller mismatch between YZN and TiN (~10%). Subsequent oxidative conversion produces an epitaxial $TiO_x$/YSZ composite on Ni. Epitaxial nitrides can also be deposited on biaxially textured metal/alloy substrates at high rates even when a large lattice mismatch between nitride and substrate is present.

A method of depositing metal nitride by high rate using magnetron sputtering is described in U.S. Pat. No. 4,428,811 which is incorporated herein by reference in its entirety. Both reactive and inert gases are admitted to the sputtering chamber. The flows were controlled in such a way that the deposition rate of sputtering is not significantly lowered than that of pure metal. The amount of the reactive gas is constantly sampled to provide a control signal used to regulate admission of the reactive gas at the proper rate for most effective deposition of the metal onto the substrate. Closed loop systems regulate the level of electrical power supplied to the target, rate of admission of the inert gas, and rate of admission of the reactive gas. Such a system can be utilized in conjunction with the present invention.

While, a typical growth of an epitaxial layer uses a constant growth temperature throughout the deposition, epitaxial YZN layers are typically deposited on biaxially textured substrates such as Ni and Ni-alloy using a two-step deposition procedure—where initial growth of YZN is done at a relatively lower temperature. Unlike other transition metal nitrides such and TiN and VN, which show relatively smaller lattice mismatch with Ni (TiN 19%, VN 18%), deposition of YZN under a constant growth temperature is not entirely successful due to very large lattice mismatch between YZN and Ni (31%).

It is observed that the oxidation process can be kinetically controlled by adjusting a parameter such as partial pressure of oxygen and/or temperature. Such control is important for obtaining smooth, crack-free oxide layers without defects associated with the conversion, i.e., spalling, cracking or bubbles due to gas elements trapped in layers. For example, epitaxial YSZ converted at 800° C. under water vapor with a partial pressure of ~0.03 atmosphere resulted in layer spallation and, gas bubble formation on oxide layer, while the X-ray characterization still showed a good biaxial texture. However, when the same conversion was done under water partial pressure of $~10^{-6}$ atmosphere, the YSZ surface showed no evidence of spalling, microcracking or gas bubbles.

The nitrides of the present invention can be oxidized in situ, (in place; e.g., within a nitride deposition chamber), or ex situ as later performed in a conventional furnace under conversion conditions if advantageous due to chemical, physical properties of a specific nitride/oxide. For example, because YBCO possess smaller lattice mismatch with $CeO_2$ (<0.1%) than with YSZ, thus may be desirable to cap the YSZ/Ni with $CeO_2$ for easier epitaxial YBCO process. One way to accomplish this would be deposit a thin CeN layer on top of the YZN layer, then convert it to the corresponding oxide. However, it is known that the CeN is reactive with atmospheric water and it is likely that a thin CeN film exposed to air will be converted to the hydroxide, thereby destroying the CeN epitaxy. Thus, it may be desirable to oxidize the CeN to $CeO_2$ in situ, under low oxygen partial pressure, then convert the remaining nitride layer under hydrogen/ water atmosphere ex situ, at a fast conversion rate without concern over substrate oxidation.

As apparent from the foregoing and as further illustrated by several examples, below, various aspects of the present invention can be utilized in the context of suitable high strength metal alloy substrates, in particular, various nickel-based substrates including various non-magnetic and/or nickel alloys including but not limited to alloys of chromium and nickel. Preferred embodiments of this invention include such nickel and/or nickel-chromium alloys in conjunction with the present methodologies for preparation of oxide films. Such alloys can also be employed in the fabrication, and as part of various resulting composites, configured composites and/or integrated devices. In this regard, the present invention is especially useful in the context of superconducting wire, tape or similar such articles. Without limitation, reference is made to several of the following examples. An especially useful nickel alloy is one comprising about 13% by weight chromium. Even so, various other non-magnetic nickel and/or nickel-chrome alloys can be used with comparable effect, as would be understood by those skilled in the art made aware of this invention.

EXAMPLES OF THE INVENTION

The following non-limiting examples and data illustrate various aspects and features relating to the buffer layers, composites, articles and methods of this invention, including the surprising and unexpected utility of the nitride materials described herein; in particular, the facile conversion thereof to the corresponding oxides. Comparable utilities and advantages can be realized using various other embodiments, consistent with this invention.

Example 1

Figure 1:
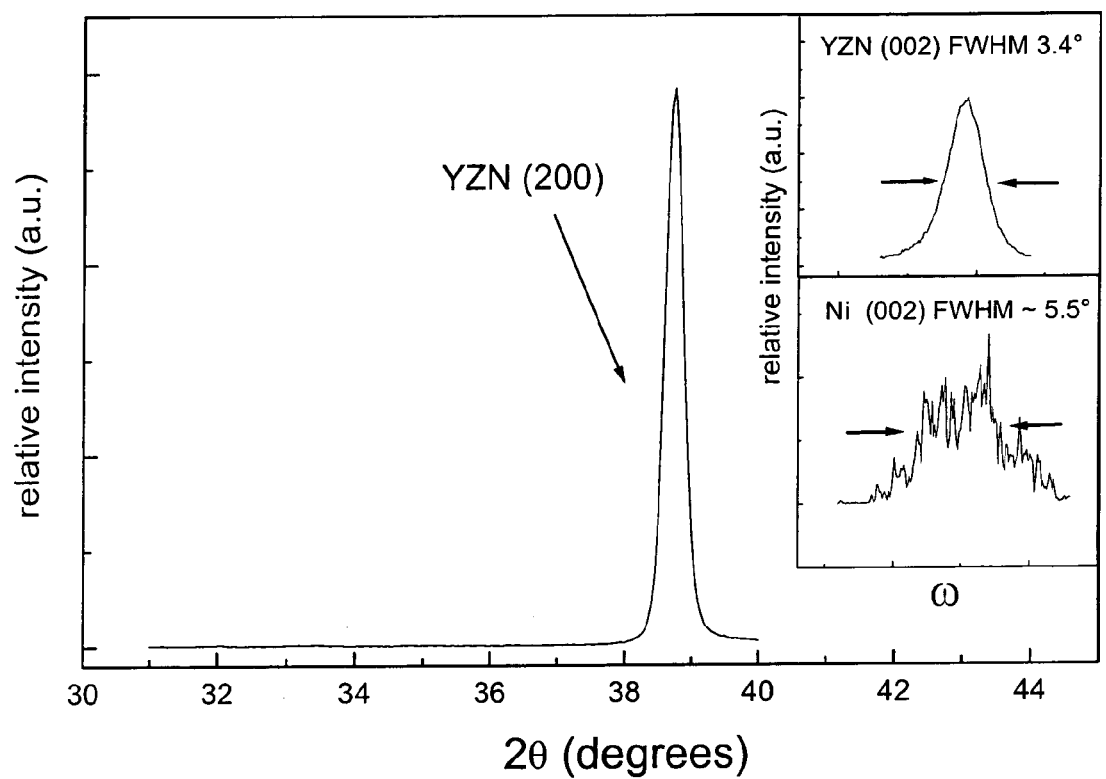
FIG. 1 shows a XRD θ-2θ scan from a $Y_{0.2}Z_{0.8}N$ film grown on Ni (001) using high-rate reactive sputtering, showing only (002) reflections.
Figure 2:
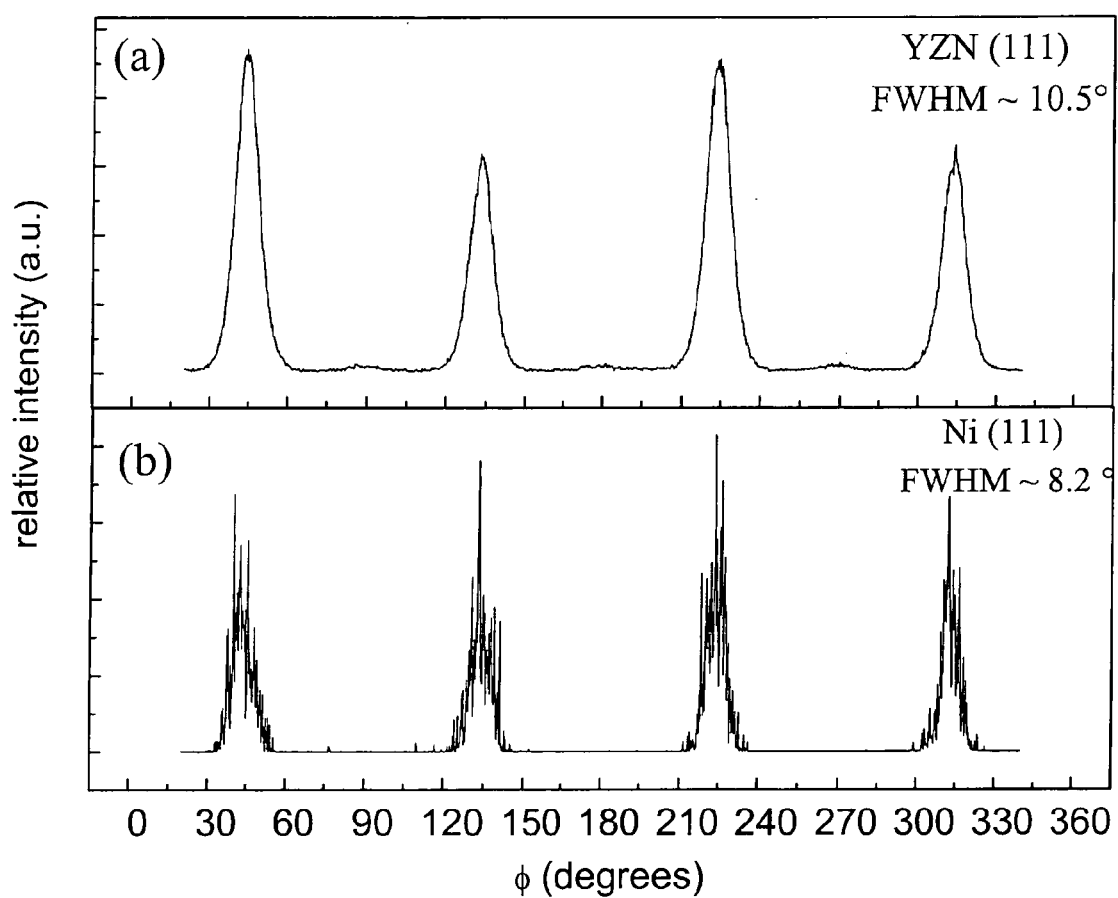
FIG. 2 compares the phi-scan from (a) YZN (111) and (b) Ni (111). The FWHM of the phi-scan peaks were ~10.5° and ~8.2° for YZN and Ni, respectively. Only a single orientation, corresponding to the cube-on-cube epitaxy of YZN on the biaxially textured Ni is evident.

Magnetron sputtered $(Zr_{0.8}Y_{0.2})N$ (YZN) films were grown on biaxially textured Ni substrate, using a two temperature technique. Initially growth was done at 500° C. until the YZN thickness reached ~30 nm. Then the growth temperature was raised to 700° C. and remained the same for rest of the deposition. Total film thickness was ~200 nm and a deposition rate of 0.12 nm/sec. The films showed good in-plane and out-of-plane alignment. FIG. 1 shows a XRD θ-2θ scan, and FIG. 2 shows the (111) pole figure. The existence of only four peaks demonstrates a single epitaxial orientation. The location of the peaks in the (111) pole figure is consistent with a cube-on-cube epitaxial relationship. The YZN (111) phi scan showed a full-width-half-maximum (FWHM) obtained by fitting a Gaussian curve to the data to be 10.5°. The FWHM is only slightly better than that of the underlying Ni with a FWHM of ~8.2°. The rocking curves FWHM (the out-of-plane texture) of the YZN layer was found to be 3.4° in rolling direction. This is almost 2° sharper than the underlying Ni substrate (5.5°).

Example 2

Magnetron sputtered $(Zr_{0.8}Y_{0.2})N$ (YZN) films were grown at a substrate temperature of ~550° C. on biaxially textured nickel substrates at a deposition rate of 0.12 nm/sec. The films had a thickness of 50 nm. The films showed in-plane and out-of-plane alignment. FIG. 3 shows a XRD θ-2θ scan, shows intense (200) peak. The presence of a (111) peak indicates that this sample has substantial out of plane texture in (200) direction but is not epitaxial. FIG. 4 shows the (111) phi-scan from same sample. The location of the peaks in the (111) phi peaks is consistent with a cube-on-cube epitaxial relationship. The YZN (111) phi scan showed a full-width-half-maximum (FWHM) obtained by fitting a Gaussian curve to the data to be 10.9°, indicating the grains that aligned to (200) orientation in out-of-plane direction also has some in-plane textures. The rocking curve FWHM (the out-of-plane texture) of the YZN layer was found to be 5.8° in rolling direction. Further deposition at a sample condition to increase thickness of YZN film resulted in polycrystalline YZN layer without any in-plane orientation.

Example 3

Figure 5:
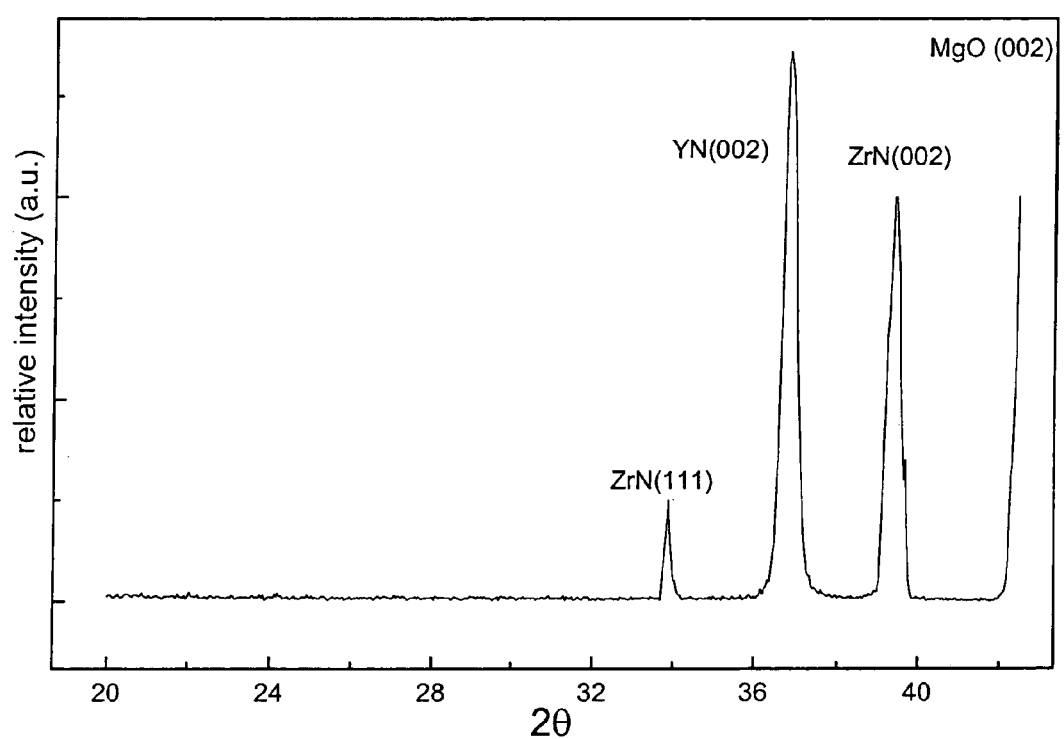
FIG. 5 shows θ-2θ x-ray diffraction (XRD) scan of a nominal $Y_{0.5}Z_{0.5}N$ film grown on MgO. The thickness of film was ~500 nm. The pattern clearly shows presence of both YN and ZrN phases suggesting a phase miscibility gap existing in the YN—ZrN pseudo-binary system at such growth temperatures.

$Y_{0.5}Z_{0.5}N$ films have been grown on single crystal MgO using reactive magnetron sputtering in order to study the solid solution range in the YN—ZrN system. Growth was carried out in $Ar—N_2$ mixtures. Typical growth temperatures ranged from 400° C. to 800° C. and typical growth rates were ~0.2 nm /sec. For deposition of $Y_{0.5}Z_{0.5}N$, 99.95% pure Y and Zr targets were used. FIG. 5 shows θ-2θ x-ray diffraction (XRD) scan of a nominal $Y_{0.5}Z_{0.5}N$ film grown on MgO. The thickness of film was ~500 nm. The pattern clearly shows presence of both YN and ZrN phases suggesting a phase miscibility gap existing in the YN—ZrN pseudo-binary system.

Example 4

Figure 6:
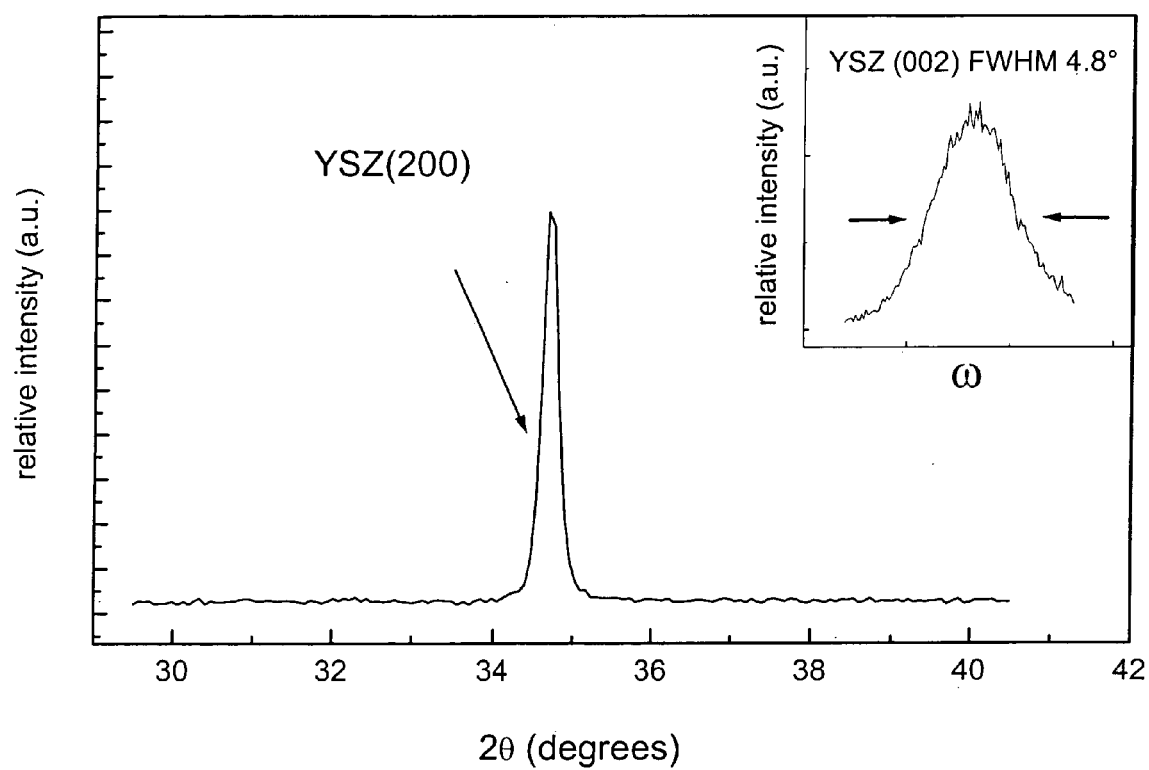
FIG. 6 shows a θ-2θ scan from a YSZ film formed by oxidation of a YZN film grown on Ni (001) using high-rate reactive sputtering, showing only (002) reflections. The YZN sample used was showed XRD peak as is illustrated in FIG. 3.
Figure 7:
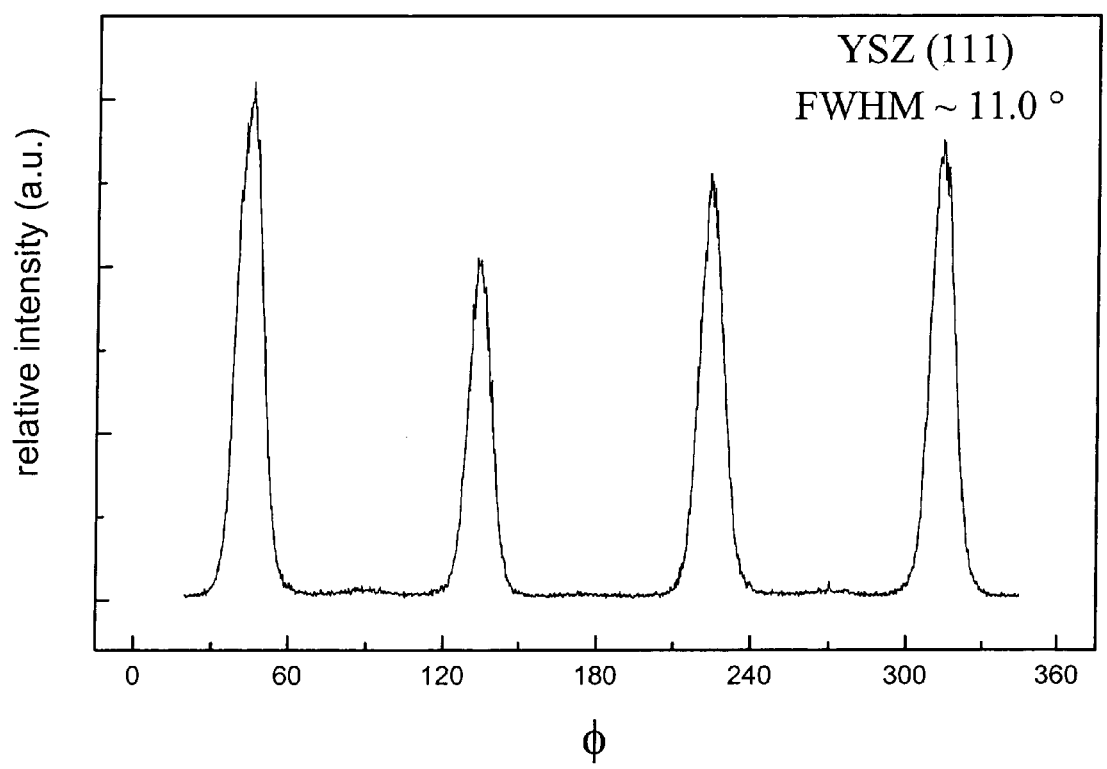
FIG. 7 compares the phi-scan from YSZ (111). The FWHM of the phi-scan peaks were ~11.0°. Only a single orientation, corresponding to the cube-on-cube epitaxy of YSZ on the biaxially textured Ni is evident. Notice that the FWHM value of YSZ (111) is close to that of YZN (111) in FIG. 4 in spite of large lattice mismatch between YSZ and YZN (11.2%).

Oxidation of the YZN films was carried out in a tube furnace in hydrogen-water vapor mixtures. The temperatures ranged from 700 to 850° C. and the time was 30 sec to 20 minute. The films showed in-plane and out-of-plane alignment comparable to the YZN source material. FIG. 5 shows a XRD θ-2θ scan, and FIG. 6 shows the (111) phi-scan plot. The existence of only four peaks demonstrates a single epitaxial orientation. The location of the peaks in the (111) pole figure is consistent with a cube-on-cube epitaxial relationship. The YSZ (111) phi scan showed a full-width-half-maximum (FWHM) obtained by fitting a Gaussian curve to the data to be 11.0°. The FWHM of the rocking curves (the out-of-plane texture) of the YSZ layer was found to be 4.8° in rolling direction.

Figure 8:
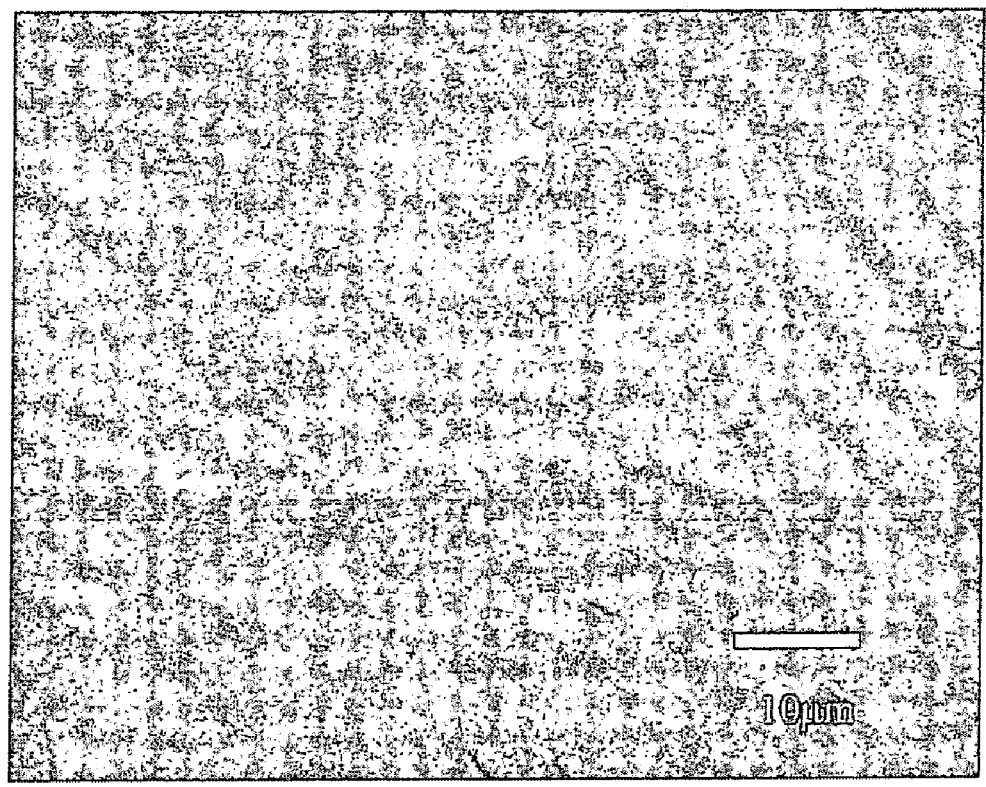
FIG. 8 shows a high magnification scanning electron micrograph of the surface of YZN deposited epitaxially on biaxially textured Ni. No evidence of any microcracks can be seen.
Figure 9:
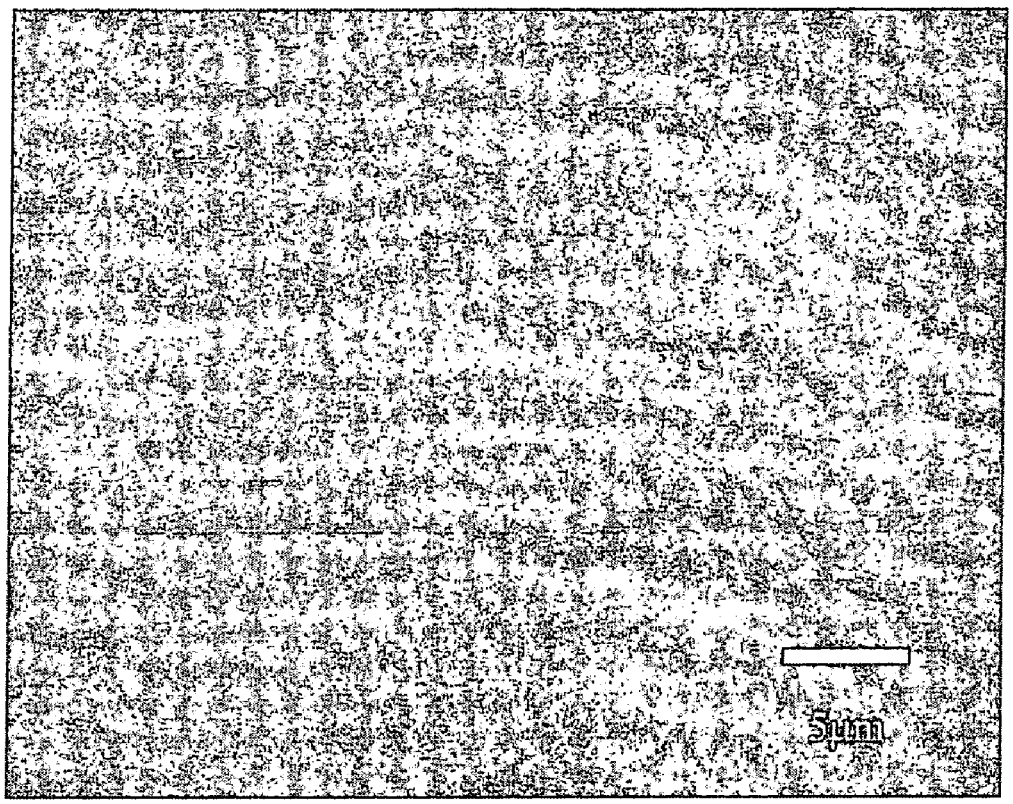
FIG. 9 shows a high magnification scanning electron micrograph of the surface of YSZ converted from YZN sample deposited epitaxially on biaxially textured Ni. No evidence of any microcracks can be seen.

FIG. 8 and FIG. 9 show a scanning electron micrograph from the surface of the as deposited YZN and YSZ film formed by oxidation of YZN, respectively. The layer is smooth and flat surfaced. No evidence of microcracking, spalling or gas bubbles was seen. Even for the case of thick YSZ layers, no cracks were observed.

The results of this example illustrate several aspects of the invention, including the following:

Excellent epitaxy of YZN can be obtained on biaxially textured Ni using reactive sputtering and two temperature technique.

The out-of-plane texture of the YZN layer is found to be significantly improved over that of Ni substrate.

Excellent epitaxy of YSZ films can be obtained on biaxially textured Ni via a simple oxidation procedure.

The resulting YSZ films are smooth with no evidence of any microcracking.

The thickness of the YSZ film was larger than YZN due to a higher molar volume for YSZ.

Example 5

Magnetron sputtered $(Zr_{0.8}Y_{0.2})N$ (YZN) films are grown on biaxially textured nickel substrates at a high deposition rate at lower temperature than that is used without substrate bias. The substrate bias results argon ion-bombardment suppressing 3 dimensional island growth, thereby facilitating YZN layers. The films have a thickness of 200 nm. X-ray diffraction characterization shows an epitaxy of YZN layer, i.e., the in-plane and out-of-plane texture, without presence of unwanted out-of plane orientation, such as (111).

Example 6

A dual opposed cathode magnetron source configuration is used to deposit $(Zr_{0.8}Y_{0.2})N$ (YZN) films at a low substrate temperature with relatively lower substrate bias on biaxially textured nickel substrates at a high deposition rate. The sputtering source is set to face each other and magnets are configured so that magnetic field around substrate sitting in between two sources is maximized. This results in an increased ion-bombardment on to the substrate and lower bias on substrate, allowing epitaxy of YZN without excessive compressive stress typically associated with ion-bombardment. This also allows deposition of epitaxial nitride layer on both side of metal/alloy substrate at single deposition run.

Example 7

Magnetron sputtered thin cubic nitrides layers are first grown at a substrate temperature of 600° C. on biaxially textured RABiTS substrates, followed by the deposition of a thick YZN layer at a relatively high deposition rate. Cubic metal nitrides first deposited include TiN, VN, CrN, and CeN. The nitride layers have thicknesses of ~10 nm and ~200 nm for thin initial nitride and subsequent YZN, respectively. These cubic nitride seed layers presumably are much better oriented compared with thin YZN directly deposited on Ni, due to their smaller lattice mismatch with Ni (2~20%) compared to that between YZN and Ni (~31%). The CeN shows best lattice match of ~2% with a 45° rotation of the CeN lattice along (001) axis. Furthermore, higher quality of epitaxial YZN is obtained on these cubic nitrides compared with direct growth of YZN on Ni, since the lattice mismatch between these layer and YZN is relatively smaller ~8–11%). Subsequent oxidation produces epitaxial oxide layer composed of YSZ on thin epitaxial $TiO_x$, $VO_x$, $\alpha$-$Cr_2O_3$, $CeO_2$. TiN and VN pseudomorphically converts to epitaxial oxides with phases having relatively small lattice mismatch with Ni and YSZ. Though $\alpha$-$Cr_2O_3$ has corundum structure with hexagonal symmetry, thin layer of CrN pseudomorphically converts to $\alpha$-$Cr_2O_3$ with such orientations that has epitaxial relationship and relatively small lattice mismatch with (001) YSZ, i.e. (101_2). Such an epitaxial relationship was previously found on epitaxial YSZ layer/$\alpha$-$Al_2O_3$ substrate. Conversion of epitaxial CrN/YZN is advantageous compared with other nitride/YZN configuration, since $\alpha$-$Cr_2O_3$ has better oxidation resistance and mechanical toughness than $TiO_x$, $VO_x$ or $CeO_2$.

Example 8

Combinations of some cubic nitrides, such as TiN, VN, ZrN, CrN, AlN and alloys (M1,M2)N, where M1 is either Ti or V, and M2 is either Cr or Al, are deposited by magnetron sputtering at a substrate temperature of 500–600° C. on biaxially textured RABiTS substrates, followed by the deposition of a YZN layer. The thickness of YZN is ~50 nm, while total thickness of the underlying nitride layer ranges 200~400 nm. A controlled oxidation converts top YZN to epitaxial YSZ, preserving underlying nitrides. Especially with underlying CrN or (M1,M2)N, where M1 is either Ti or V, and M2 is either Cr or Al, high oxidation resistance of nitride prevents oxidation of bulk nitride layer during YBCO growth process. A thin non-epitaxial $Al_2O_3$ or $Cr_2O_3$ layer may form under YSZ layer during YBCO growth process, but this does not effect the growth of YBCO, since YSZ layer is already epitaxial. Furthermore, $Al_2O_3$ or $Cr_2O_3$ layers do not reduce overall mechanical toughness of the buffer layers, since they remain thin. The thickness and composition of these bulk nitride layers can be tailored depending on the deposition condition of specific YBCO growth process used.

Example 9

A thin CeN and (Sr,Ti)N, (La,Al)N layer are deposited on top of YZN buffer layers grown on Ni. (Sr,Ti)N grows on YZN epitaxially, since strontium mononitride has B1 rocksalt structure same as TiN. However, thin layer of these nitrides is not stable under air. Specifically, rare-earth nitride, like CeN is known to react with atmospheric moisture and convert into hydroxides upon air exposure. Thus an in-situ oxidation with oxygen gas is used to convert CeN, (Sr,Ti)N, and (La,Al)N to $CeO_2$, $SrTiO_3$ and $LaAlO_3$ without taking the sample out of deposition chamber. A controlled conversion of top layers is straightforward for an in-situ oxidation. These thin oxide top layers are advantageous, because they lattice match to YBCO better (<0.1%) than that of YSZ.

Example 10

Epitaxial rocksalt structure (Y,Zr)C layers are grown at a substrate temperature of 600° C. on biaxially textured nickel substrates at a deposition rate of 1 Angstrom/second using either (Y,Zr)C target or (Y,Zr) alloy target with carbon-providing reactive gas such as methane. Subsequent oxidation under hydrogen/water vapor mixture converts (Y,Zr)C layers to epitaxial YSZ layers. Since the carbon contamination of YBCO is detrimental to its superconducting properties, a complete conversion of carbide to oxide is important. Thus, stronger oxidizing agents such as oxygen, ozone, peroxide or metal-organic oxygen sources are also used.

Example 11

Figure 10:
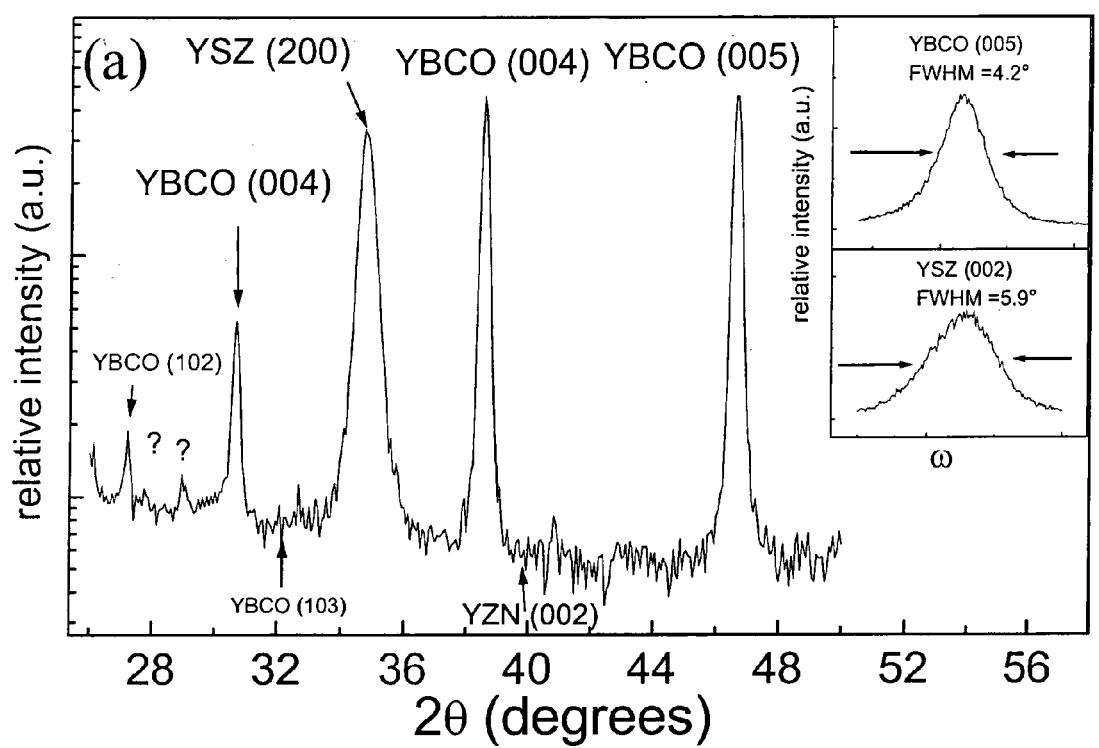
FIG. 10 θ-2θ XRD scan from YBCO coated YSZ (100 nm)/Ni samples. Inset compares rocking curve from YBCO (005) and YSZ (200).
Figure 11:
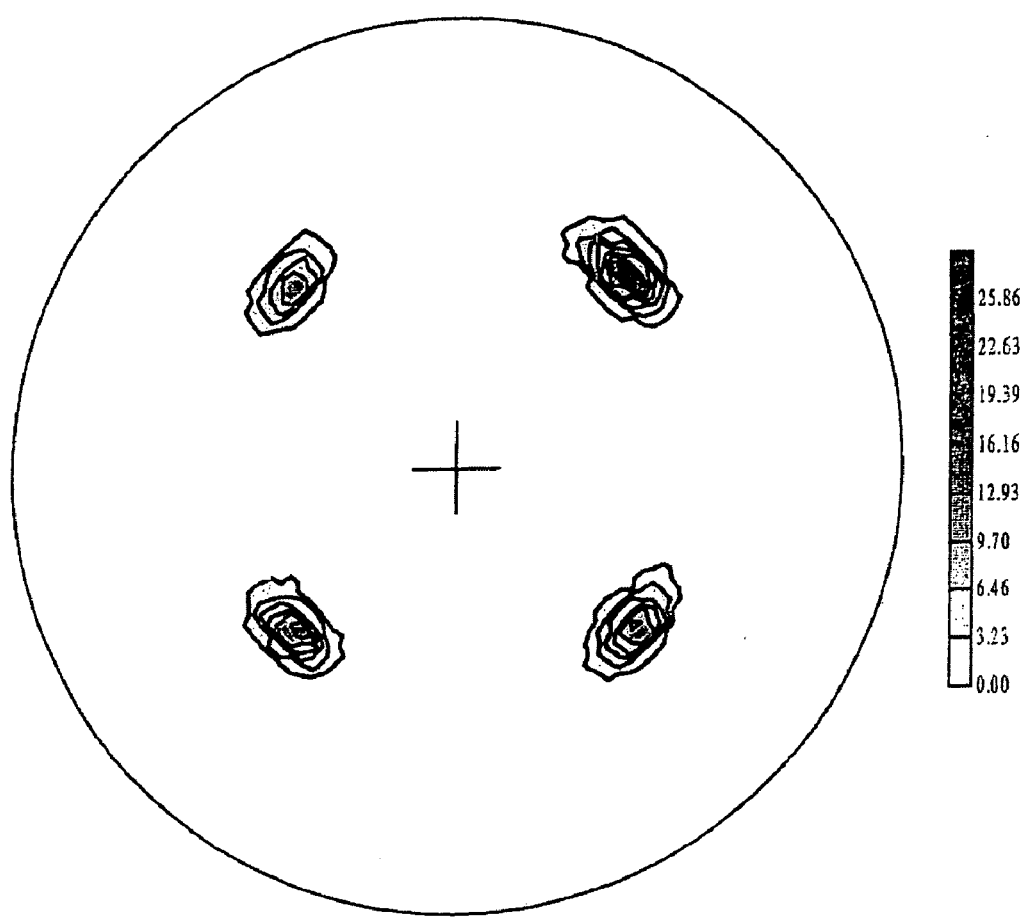
FIG. 11 shows a YBCO (103) pole figure for a YBCO/converted YSZ/Ni sample. Only a single orientation, corresponding to the cube-on-cube epitaxy of YSZ on the biaxially textured Ni is evident.
Figure 12:
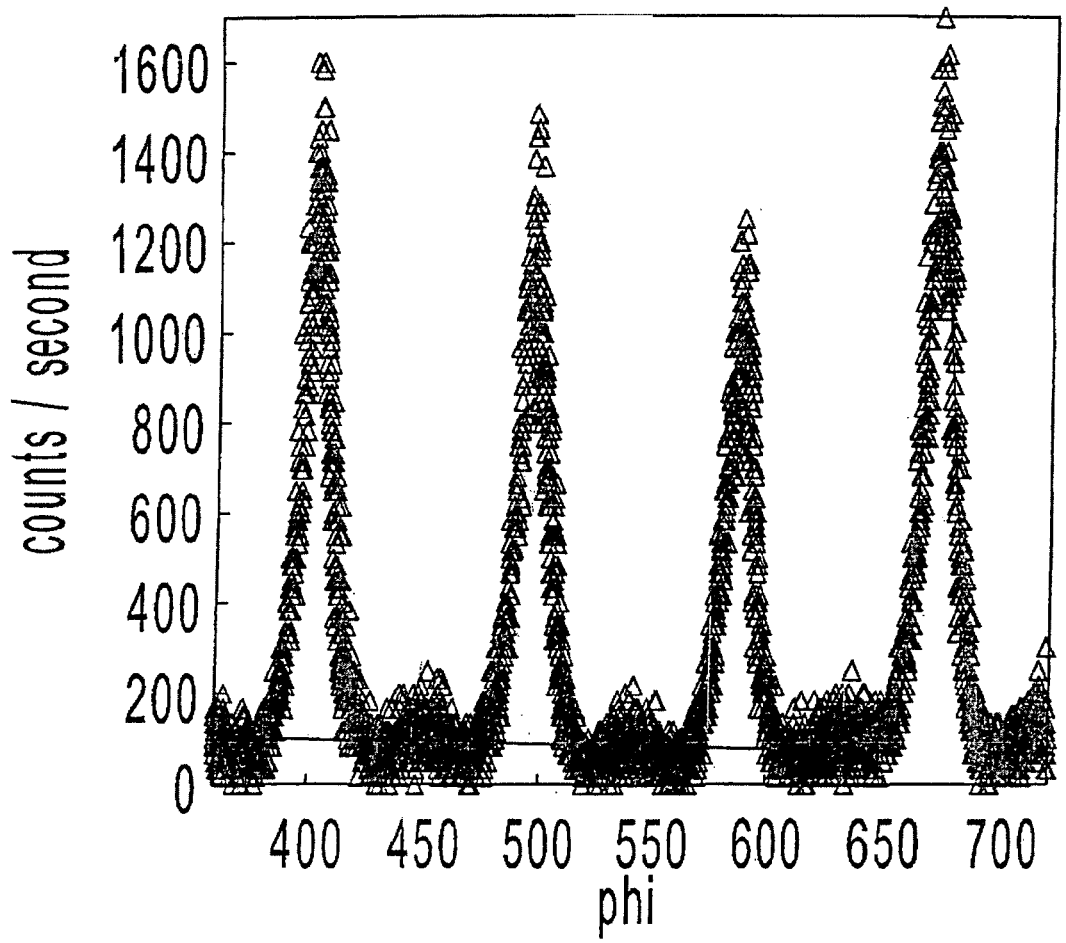
FIG. 12 shows phi-scan of YBCO (103) from YBCO/converted YSZ/Ni sample, The FWHM value was 15°. The value for YBCO is typically consistent with high $J_c$ values.

PLD can be used to deposit YBCO on the YSZ/Ni fabricated by methods described in Example 3. FIG. 10 is a $\theta$-$2\theta$ x-ray diffraction (XRD) scan of the YBCO/YSZ/Ni multilayer sample. The primary peaks are that corresponding to YSZ (002), Ni (002), and YBCO (00l). This indicates the out-of-plane orientation expected for the epitaxial multilayer structure. In order to uniquely determine the epitaxy, it is necessary to measure phi-scans and rocking curves from the multilayer structure. The phi-scan of the Ni (220) reflection indicated a FWHM of ~9.2° for this sample. The phi-scan of the YSZ (220) reflection indicated a FWHM of ~12.6°. The phi-scan of the YBCO (103) reflection indicated a FWHM of ~15°. This data is shown in FIG. 11 and 12.

Example 12

Figure 13:
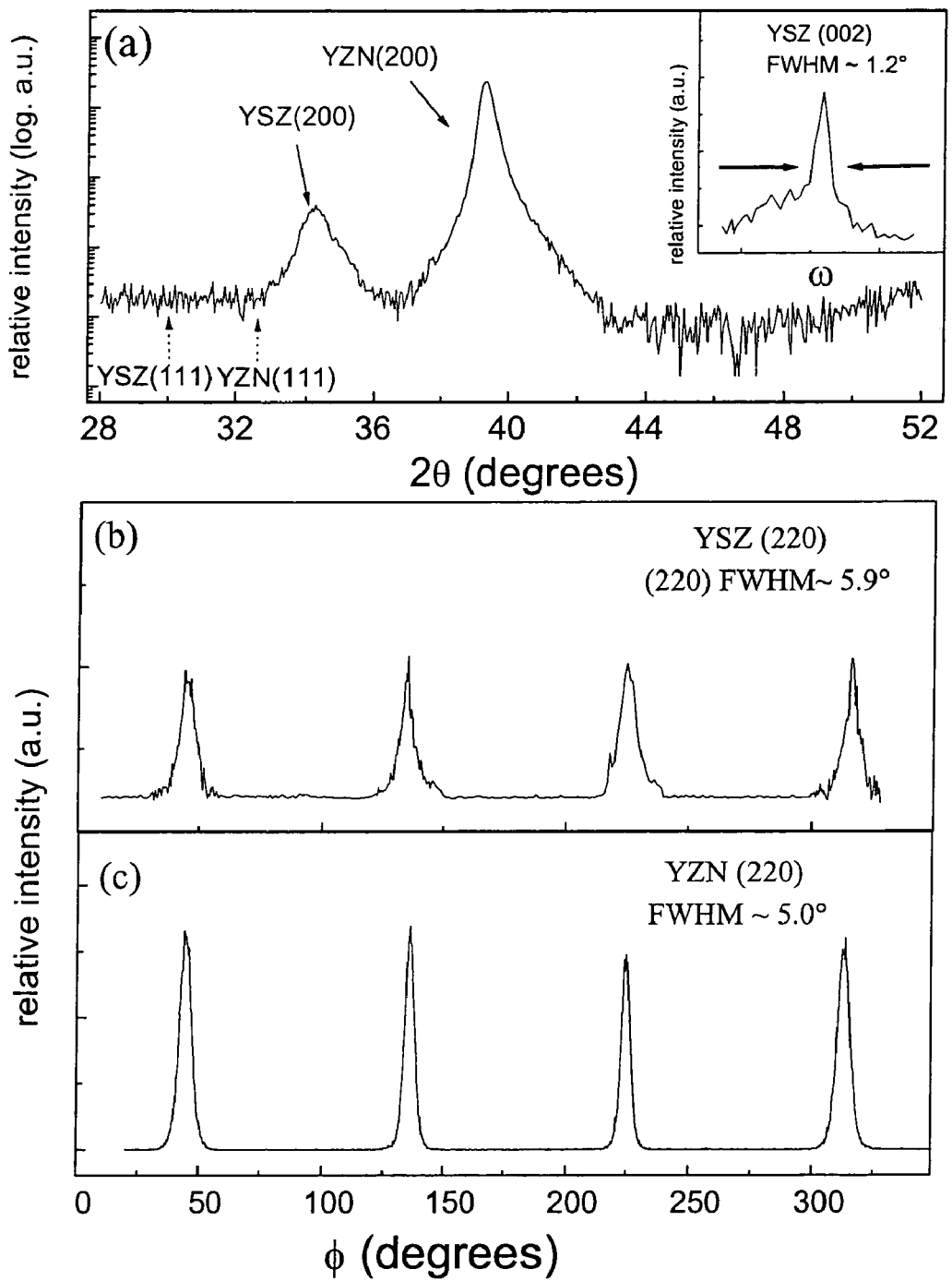
FIG. 13(a) is a θ-2θ x-ray diffraction (XRD) scan of a typical film, showing only YZN (002) and YSZ (002) peak from as oxidized YZN films. The off-axis phi-scan of the TiN (220) and YSZ (220) peaks shown in FIGS. 13(b) and (c) respectively, verifies the cube-on-cube epitaxial orientation of YSZ on YZN.
Figure 14:
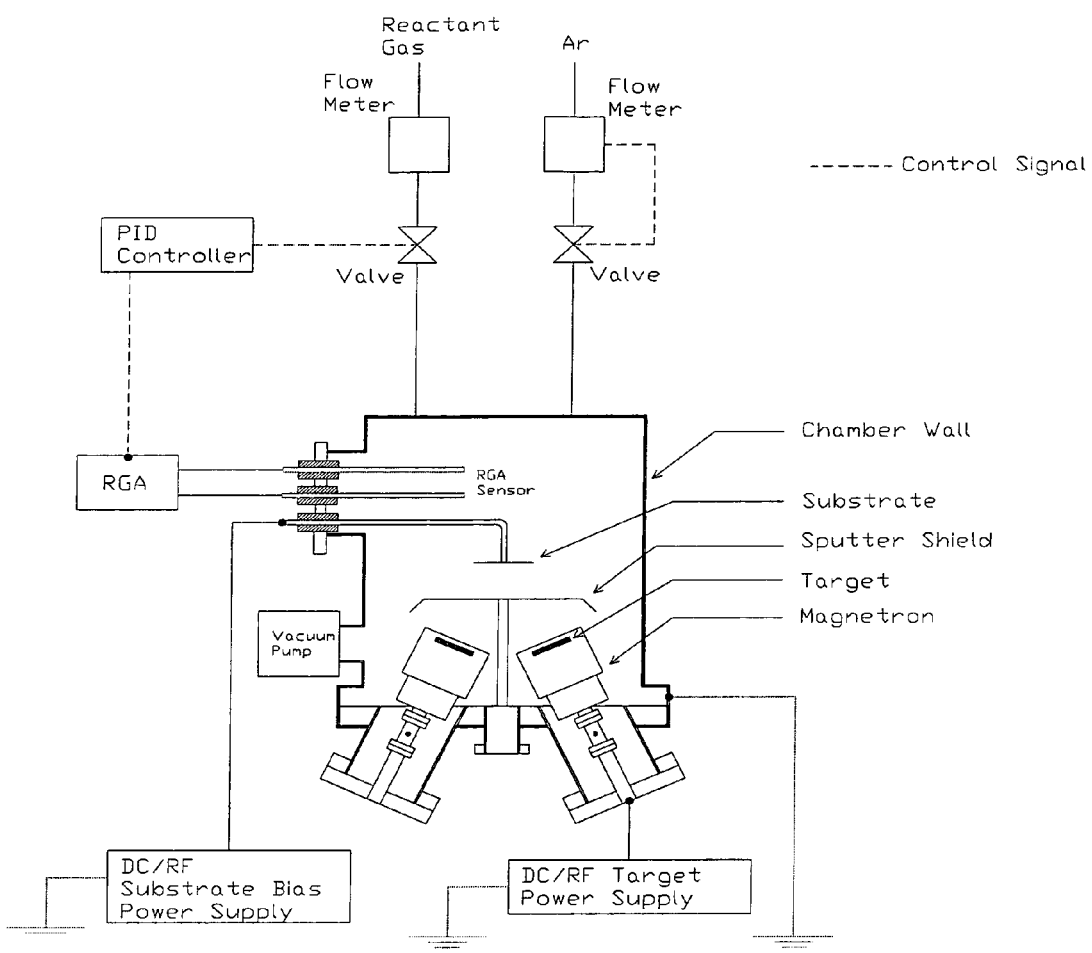
FIG. 14 is a schematic representation of a UHV reactive magnetron sputtering chamber of the type useful with the method(s) of this invention.
Figure 15:
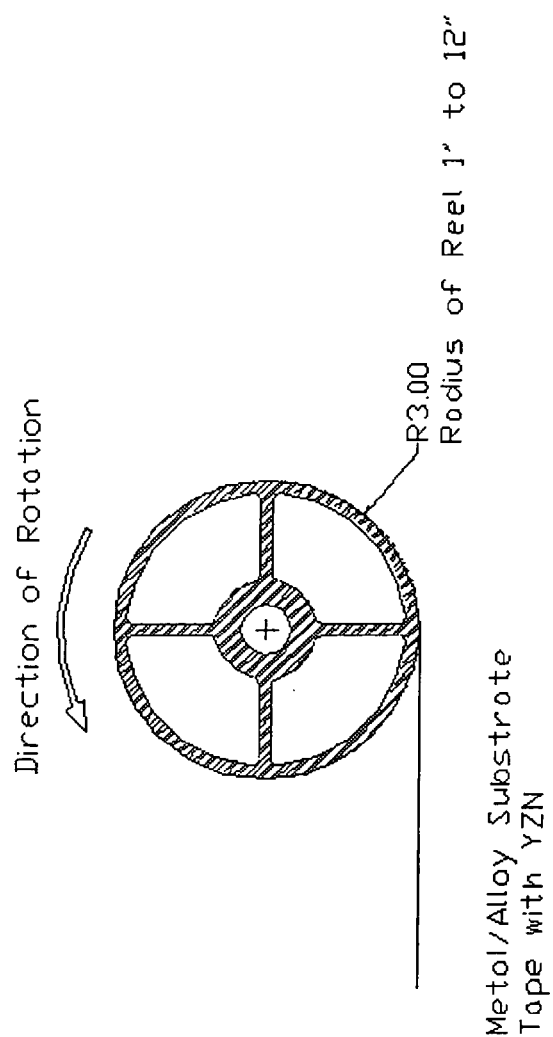
FIG. 15 illustrates schematically a wound and/or spooled composite configuration, such composite as can be configured in accordance with the preparation and/or manufacturing methods described herein. For purposes of illustration, only, the composite tape, including YZN or other nitrides of this invention, can be wound on a spool/reel to provide curved configurations varying with the dimensions thereof (e.g.—spooled radii from 1–12 inches).
Figure 16:
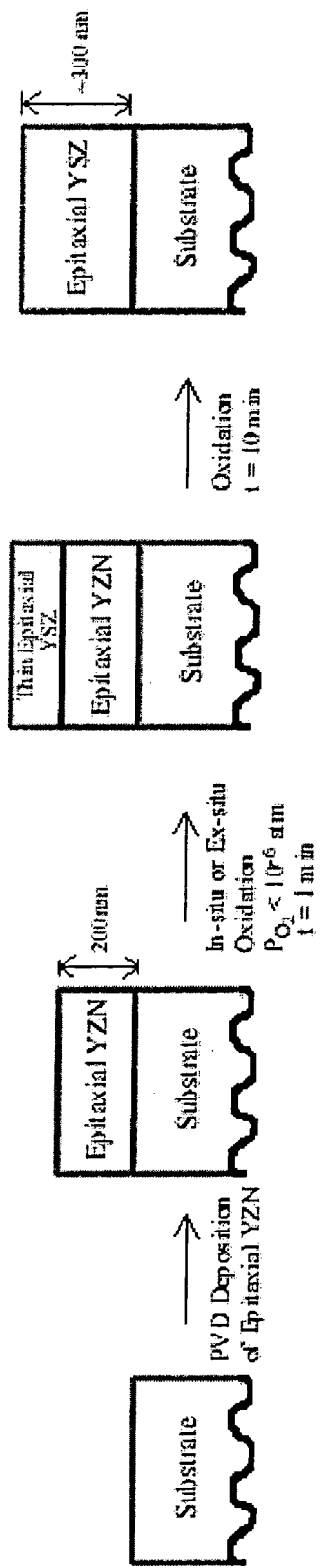
FIG. 16 provides a schematic depiction of several thin film fabrications, each of which is in accordance with the present invention, but only illustrative of the methods provided elsewhere herein.

An epitaxial YZN film has been grown on Sapphire substrate and subsequently in-situ oxidized using oxygen gas to fabricate thin YSZ/YZN/sapphire structure. The range of oxygen pressure and oxidation temperatures used for were between $10^{-6-10-2}$ Torr and 700~950° C., respectively. FIG. 13($a$) is a θ-2θ x-ray diffraction (XRD) scan of a typical film, showing only YZN (002) and YSZ (002) peak from as oxidized YZN films. The off-axis phi-scan of the TiN (220) and YSZ (220) peaks shown in FIGS. 13($b$) and ($c$) respectively, verifies the cube-on-cube epitaxial orientation of YSZ on YZN. The slightly larger FWHM from YSZ (~5.9°) compared to that of YZN (220) (~5.0°) is probably due to relatively large lattice mismatch between YSZ and YZN (~10.4%). The rocking curve FWHM (~1.2°) for this thin YSZ film is better than that from typical YZN.

Example 13

Oxidations of the epitaxial nitride films described in earlier examples (including YZN) can be carried out in a tube furnace in hydrogen-water vapor mixtures. The oxidation conditions and processes can be chosen such that the epitaxial nitrides are converted to epitaxial oxide and formation of a thin NiO is allowed at the interface of epitaxial oxide and Ni substrate. Such a structure shows a better adhesion compared to Ni/epitaxial oxide without interfacial NiO because Ni/NiO shows inherently better adhesion due to Ni—Ni bonding in the interface, while NiO/other epitaxial oxides also shows good adhesion between oxides.

Example 14

Figure 17:
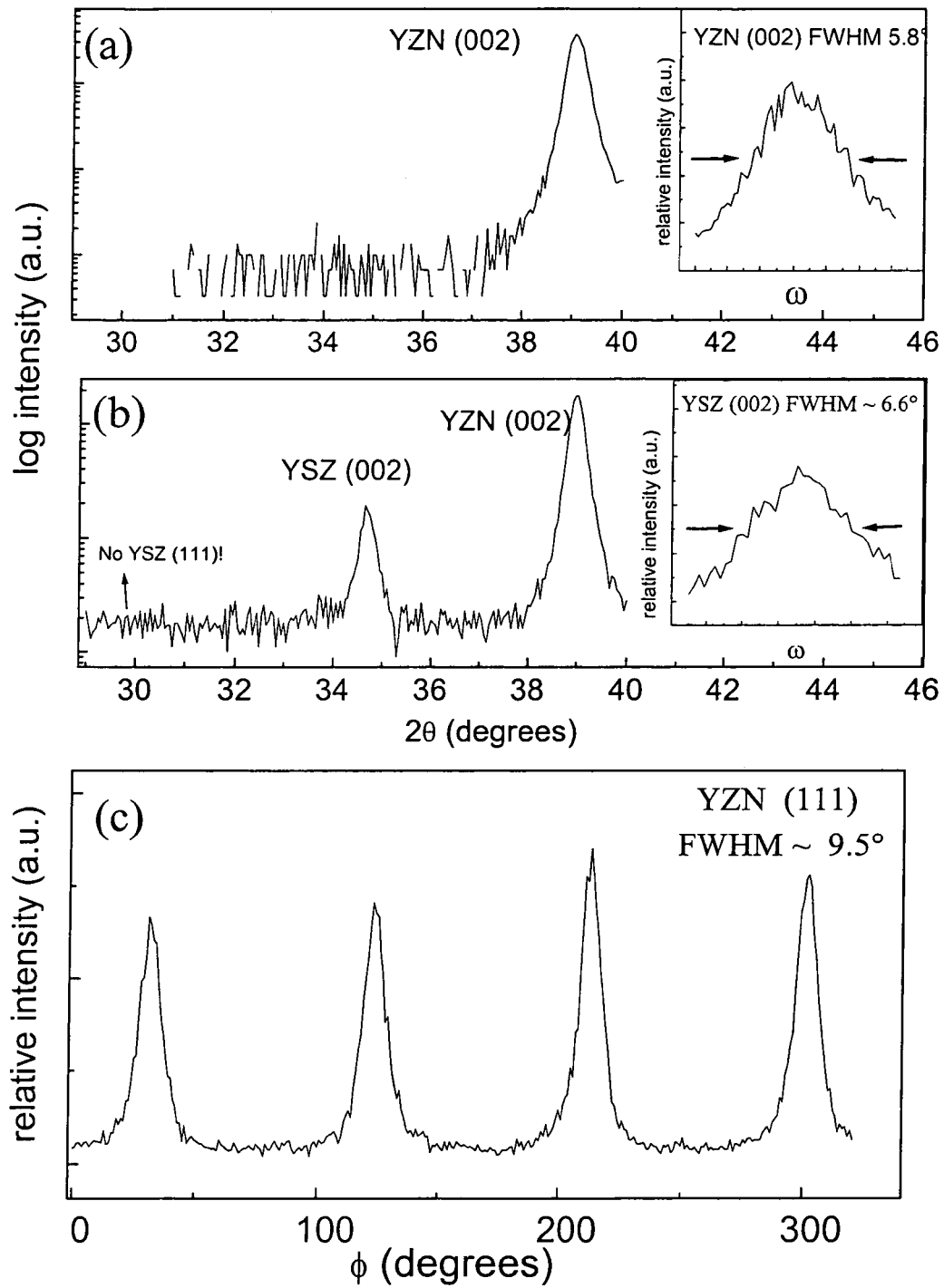
FIG. 17 shows three, (a)–(c), XRD scans as more fully discussed in Example 14.
Figure 18:
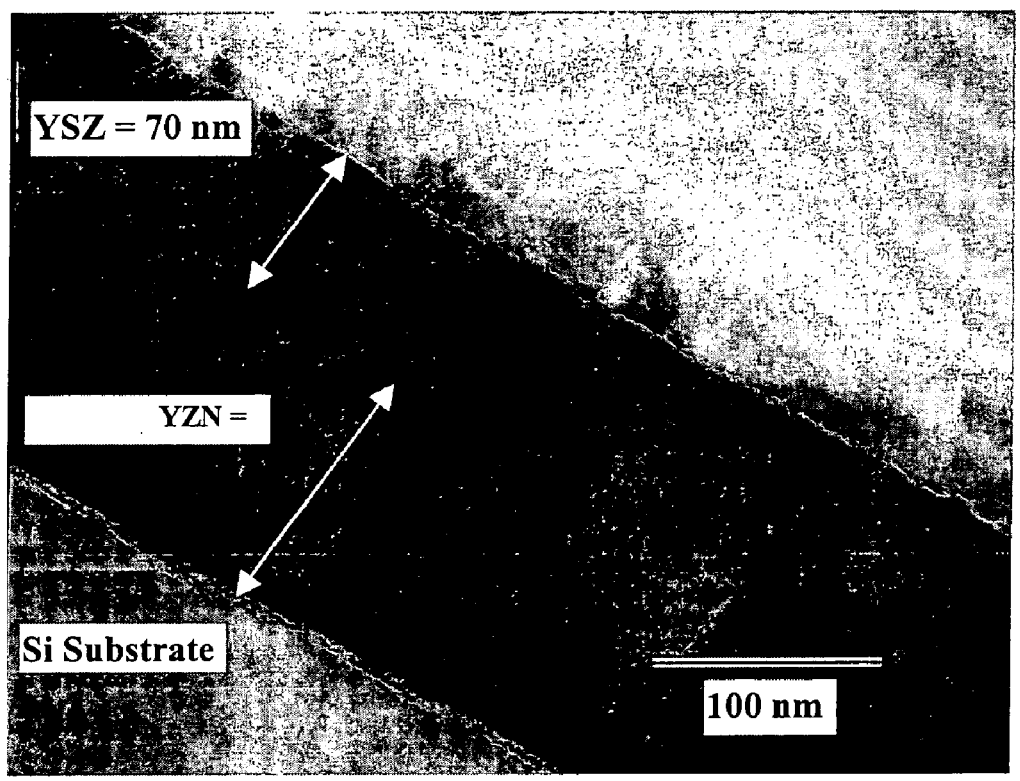
FIG. 18 is a cross-section TEM bright field micrograph image from YSZ/YZN/Si sample. The YSZ and YZN layers are clearly distinguished, with a thickness of 70 and 130 nm, respectively. Both YSZ and YZN layers have a columnar structure and the YSZ/YZN interface appears well-defined and relatively flat and smooth. There is no indication or formation of significant intermediate phase in the interface.
Figure 19:
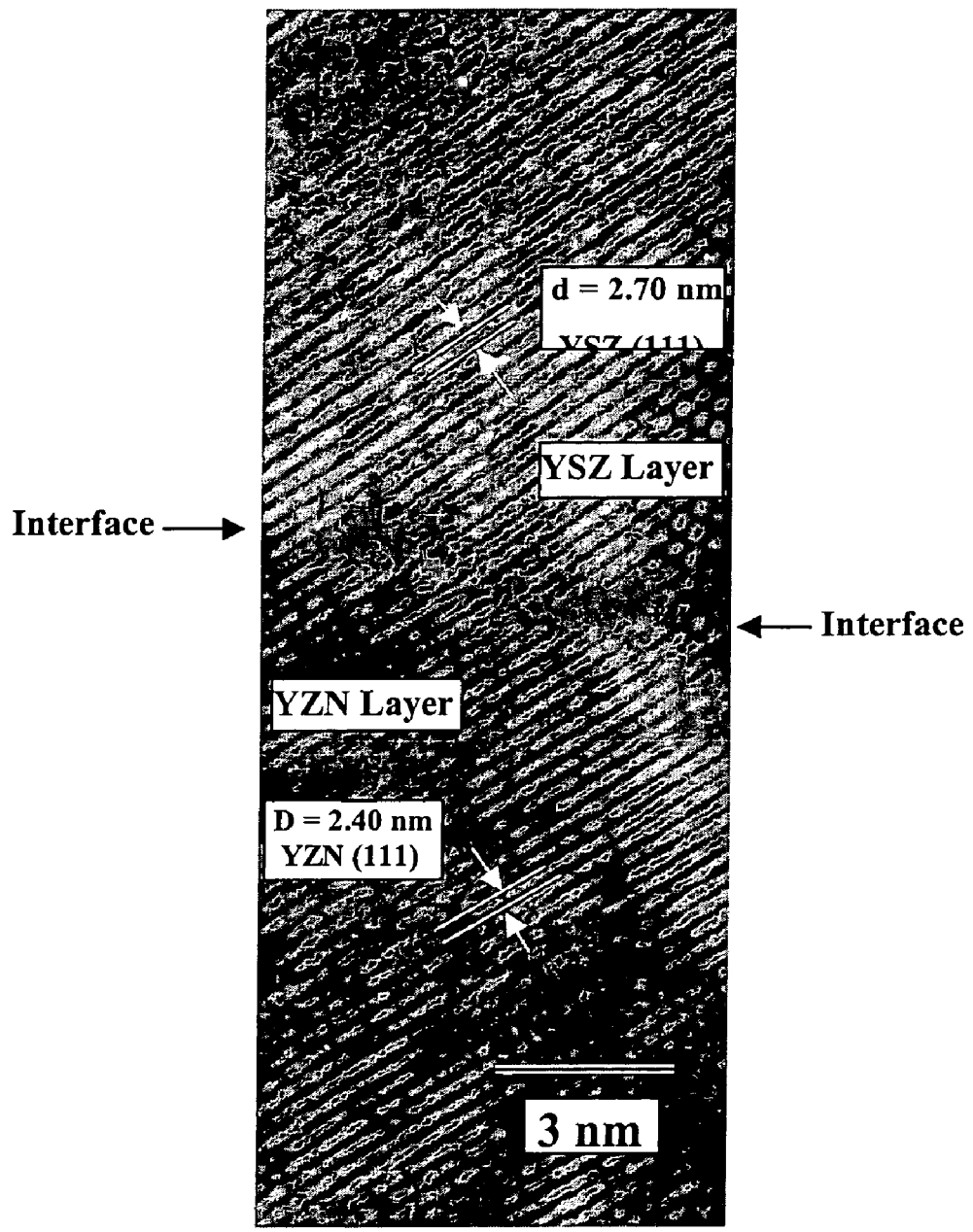
FIG. 19 is a high-resolution cross-section TEM bright field image showing atomic planes near YSZ/YZN interface. The YSZ (111) atomic plane runs from top to interface region continuously and continue to YZN (111) plane. The interface is sharp and appears to be locally coherent in singe grains, clearly indicating that there are no intermediate phase present near the interface, as would be advantageous for process control and device design as well as for improved performance of such devices like oxygen sensors.

Magnetron sputtered $(Zr_{0.8}Y_{0.2})N$ (YZN) films were grown on single crystal Si substrate, using two temperature technique. Initially growth was done at 600° C. until the YZN thickness reached ~40 nm. Then the growth temperature was raised to 900° C. and remained the same for rest of the deposition. Total film thickness was ~200 nm and a deposition rate of 0.12 nm/sec. As grown YZN film on Si was partially oxidized in a tube furnace under hydrogen-water vapor mixtures. The annealing temperature was 750° C. and the time was 30 sec. FIG. 17($a$) shows a XRD θ-2 θ comparing before the oxidation. The scan shows YZN (200) peak only, indicating a strong out-of-plane texture. FIG. 17($b$) shows the (111) pole figure from as deposited YZN film on Si. The existence of only four peaks demonstrates a single epitaxial orientation. The location of the peaks in the (111) pole figure was consistent with a cube-on-cube epitaxial relationship. The YZN (111) phi scan showed a full-width-half-maximum (FWHM) obtained by fitting a Gaussian curve to the data to be ~9°. FIG. 17($c$) shows a XRD θ-2 θ scan after the oxidation. In addition to an intense YZN (200), much smaller but distinctive YSZ (200) peak is present, suggesting that a thin YSZ films has been formed, on thicker underlying YZN film. There are no other peaks that can be seen, indicating strong out-of-plane texture of YSZ films. The rocking curves FWHM (the out-of-plane texture) of the YZN layer was found to be ~2° similar to that of underlying epitaxial YZN layer.

Example 15

Figure 20:
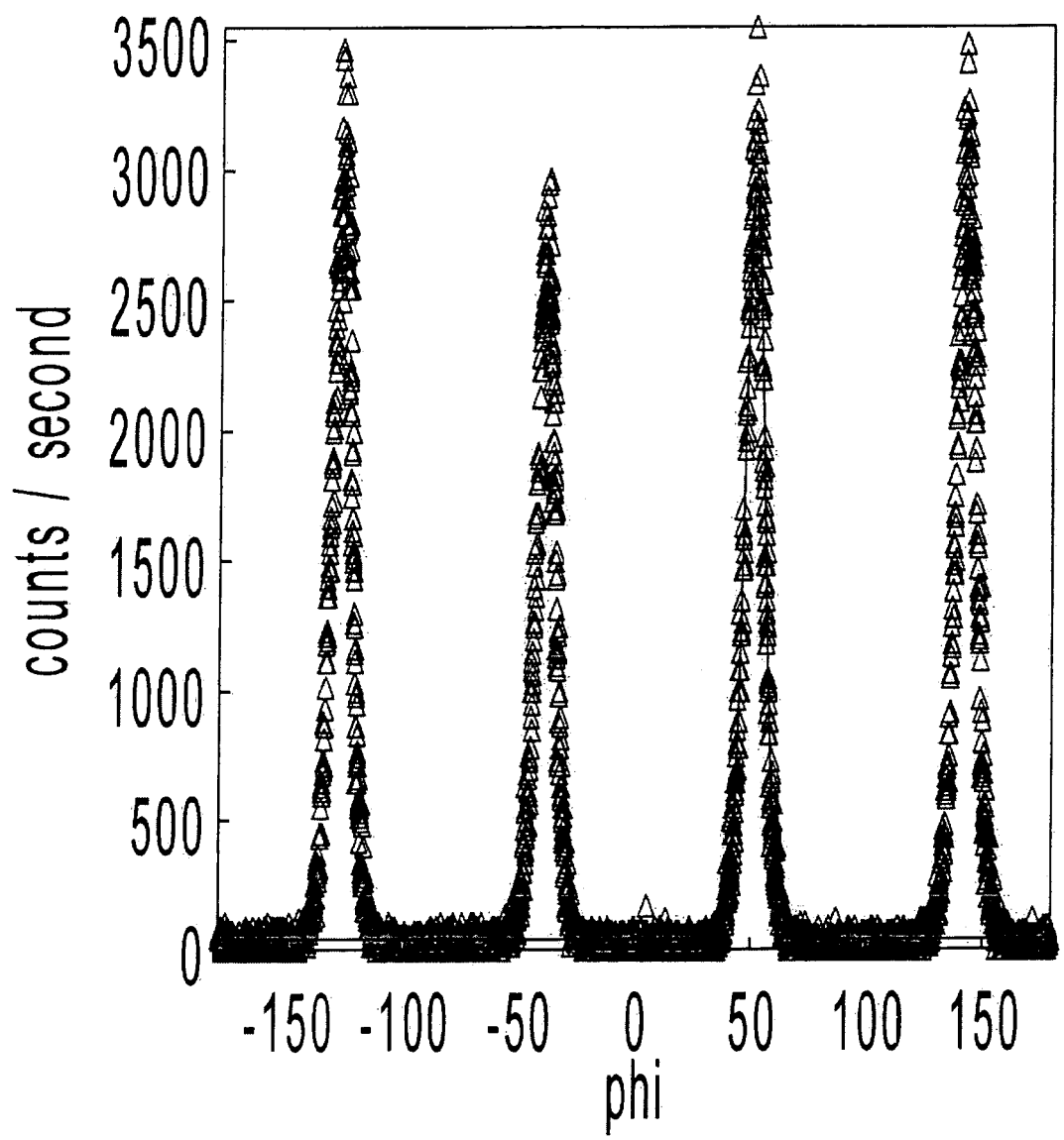
FIG. 20 is a phi scan of Ni (111) showing FWHM ~9.22°; see Example 15.
Figure 21:
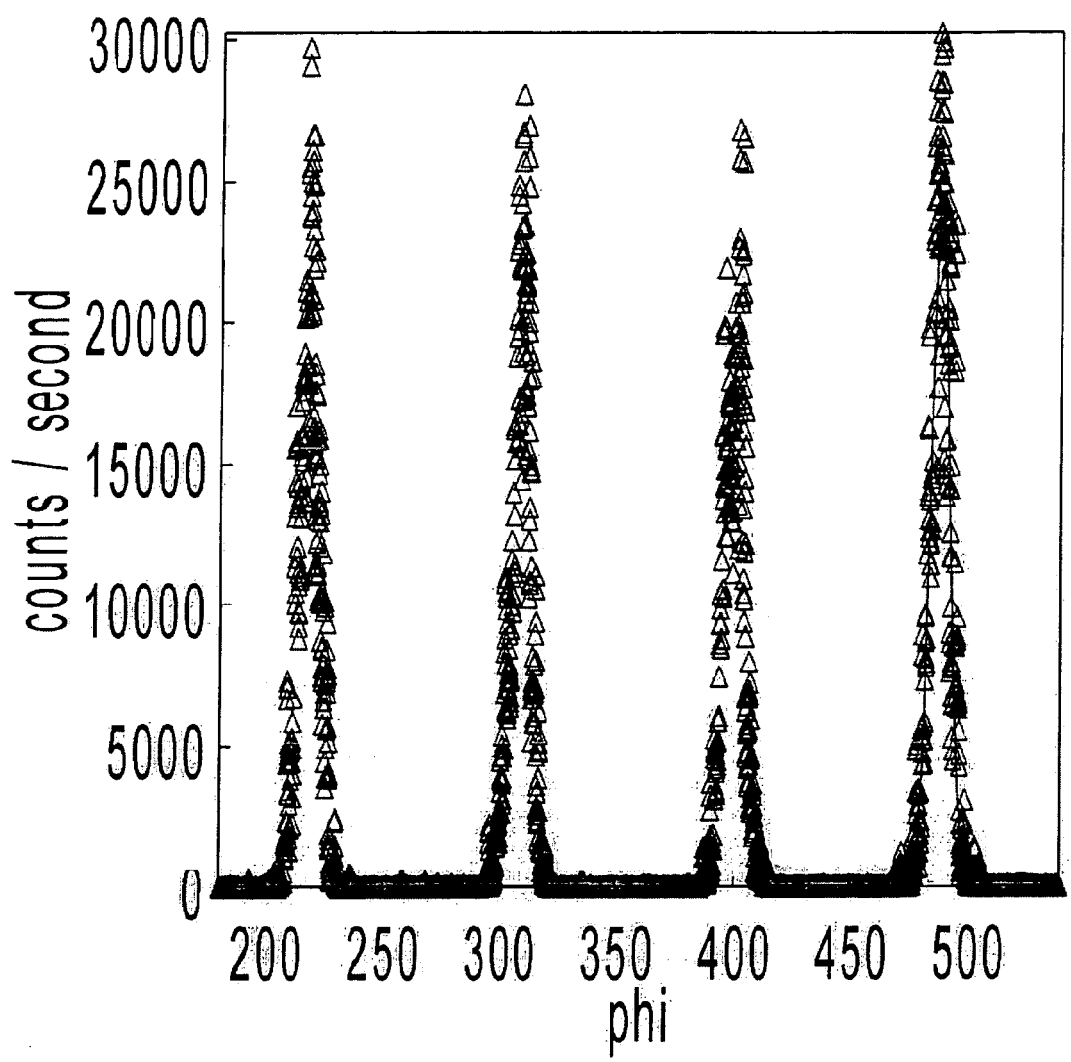
FIG. 21 is a phi scan of YSZ (111) showing FWHM ~10.04°; see Example 15.
Figure 22:
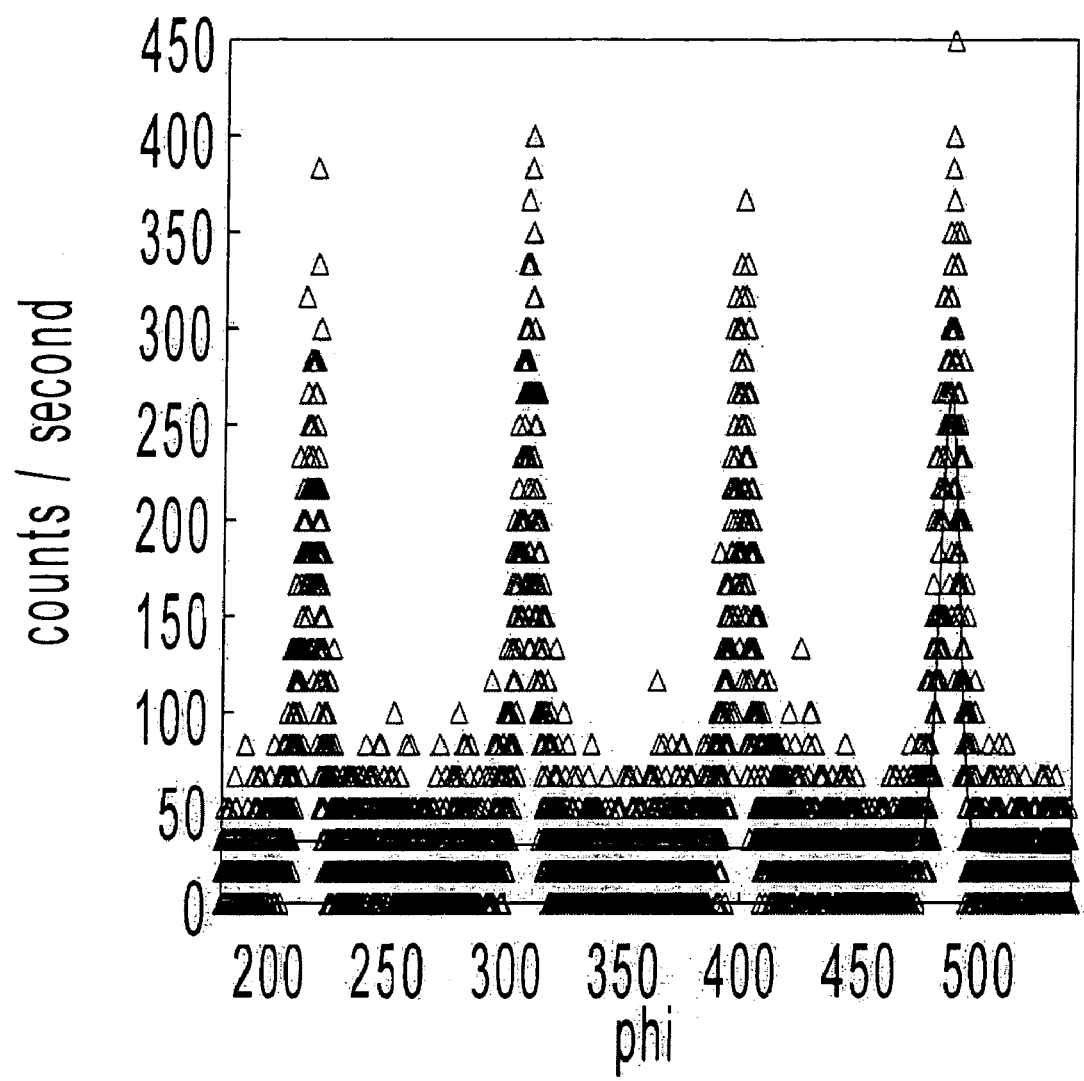
FIG. 22 is a phi scan of CeO$_2$ (111) showing FWHM ~9.52°; see Example 15.
Figure 23:
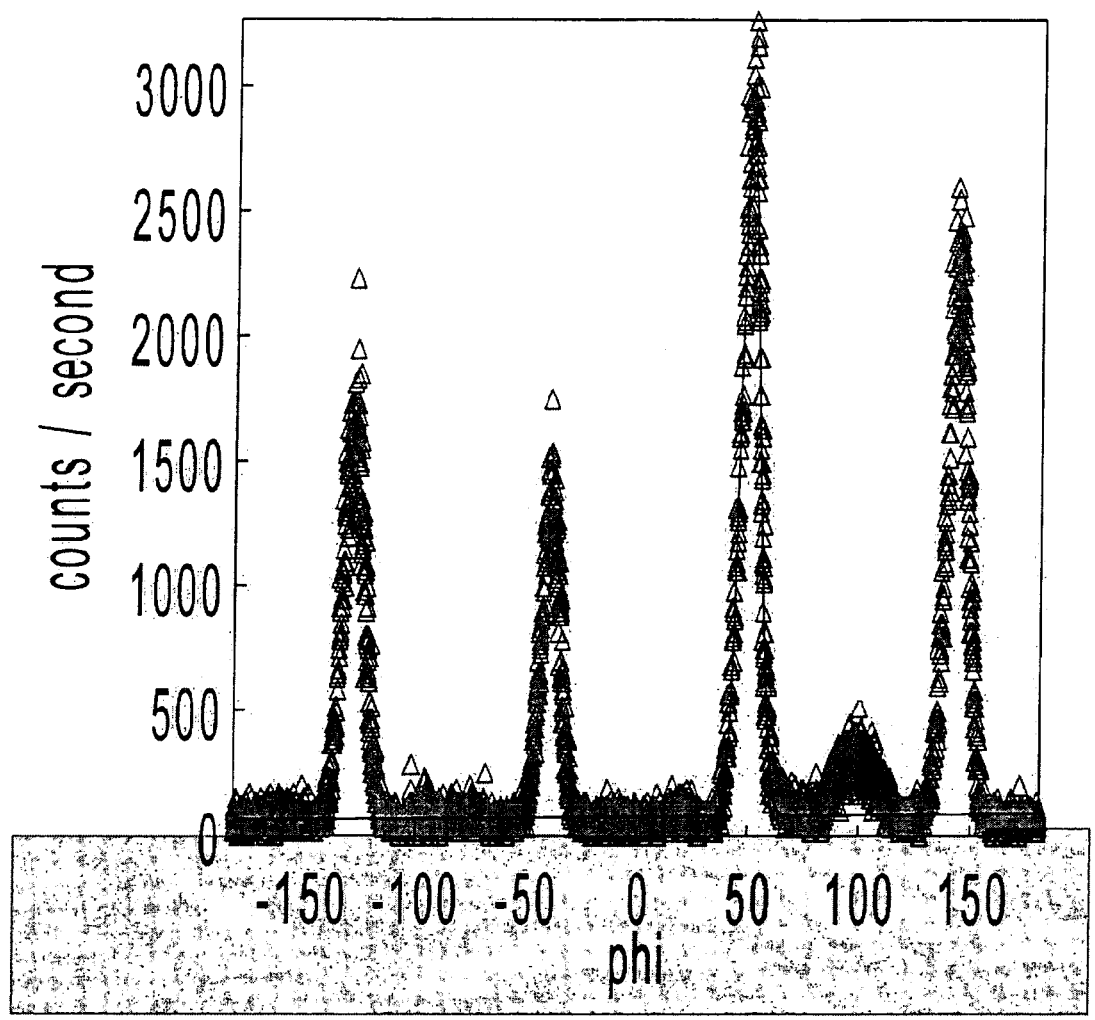
FIG. 23 is a phi scan of YBCO (111) showing FWHM ~9.52°; see Example 16.

Standard Pulsed Laser Deposition (PLD) was used to deposit ~20 nm thick ceria layers on YSZ buffers, prepared by Applied Thin Films, Inc. (ATFI), in order for better lattice match with YBCO. The ATFI YSZ was converted from YZN using oxidation procedures described herein. Epitaxial YBCO (~250 nm thick) was subsequently deposited by PLD. FIGS. 20–23 show typical phi-scans from YBCO/ceria/ATFI YSZ/Ni-RABiTS™ with corresponding FWHM: FIG. 20 Ni (111): 9.22°, FIG. 21 ATFI YSZ (111): 10.04°, FIG. 22 $CeO_2$ (111) ~9.52° and FIG. 23 YBCO (103) ~9.97°.

Example 16

Figure 24:
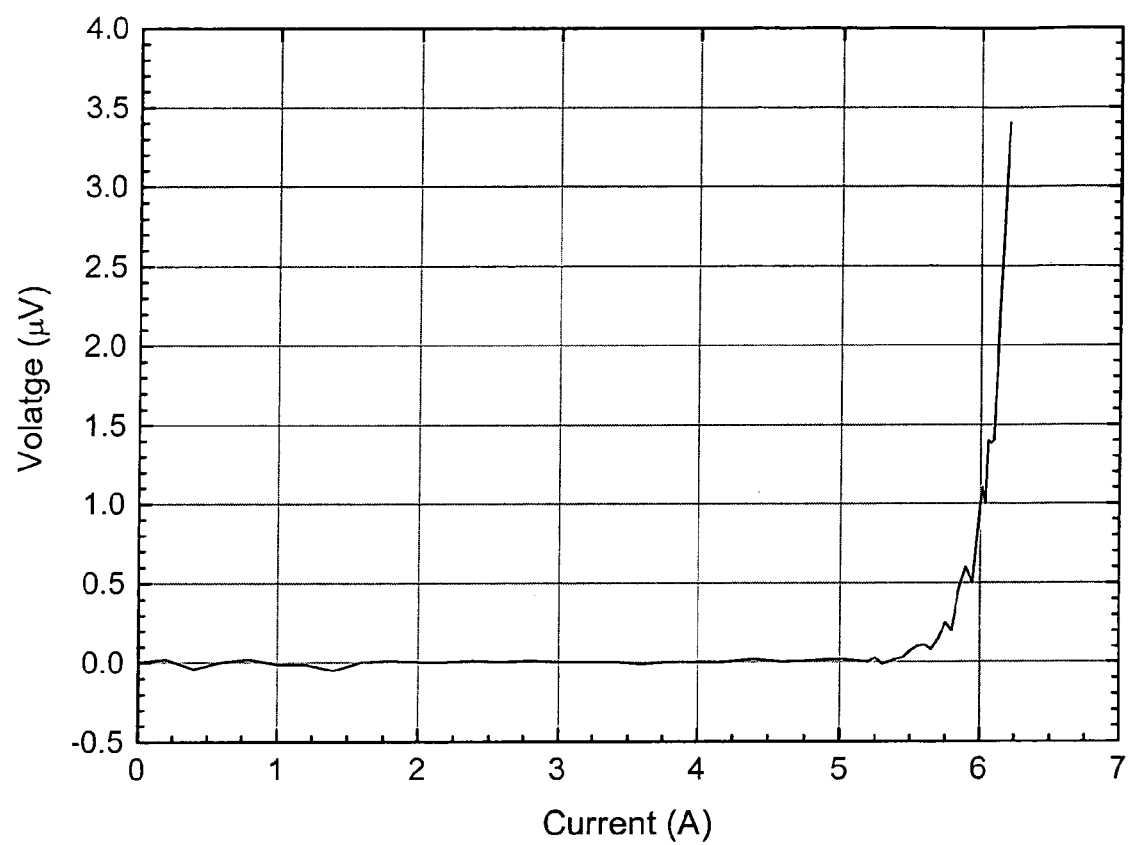
FIG. 24 shows $J_c$ measurement on 250 nm thick YBCO grown on Ceria/ATFI-YSZ/Ni corresponding to a calculated $J_c$ value ~1.0×10$^6$ A/cm$^2$ at 77K by whole body transport current measurement in self-field using a 1 μv/cm criteria; see Example 16.

Subsequent to YBCO growth, Jc and Tc superconductivity measurements were done on a ceria-capped ATFI YSZ buffer such as that prepared in Example 15. FIG. 24 shows a representative I-V curve from Jc measurement on 200 nm thick YBCO, showing Ic=6 amps at 1 μV/cm criterion. The width of film was 3 mm, resulting in calculated Jc of 1 $MA/cm^2$. This Jc value was precisely reproduced for a subsequent sample, with I-V curve almost identical for both samples.

Example 17

Figure 25:
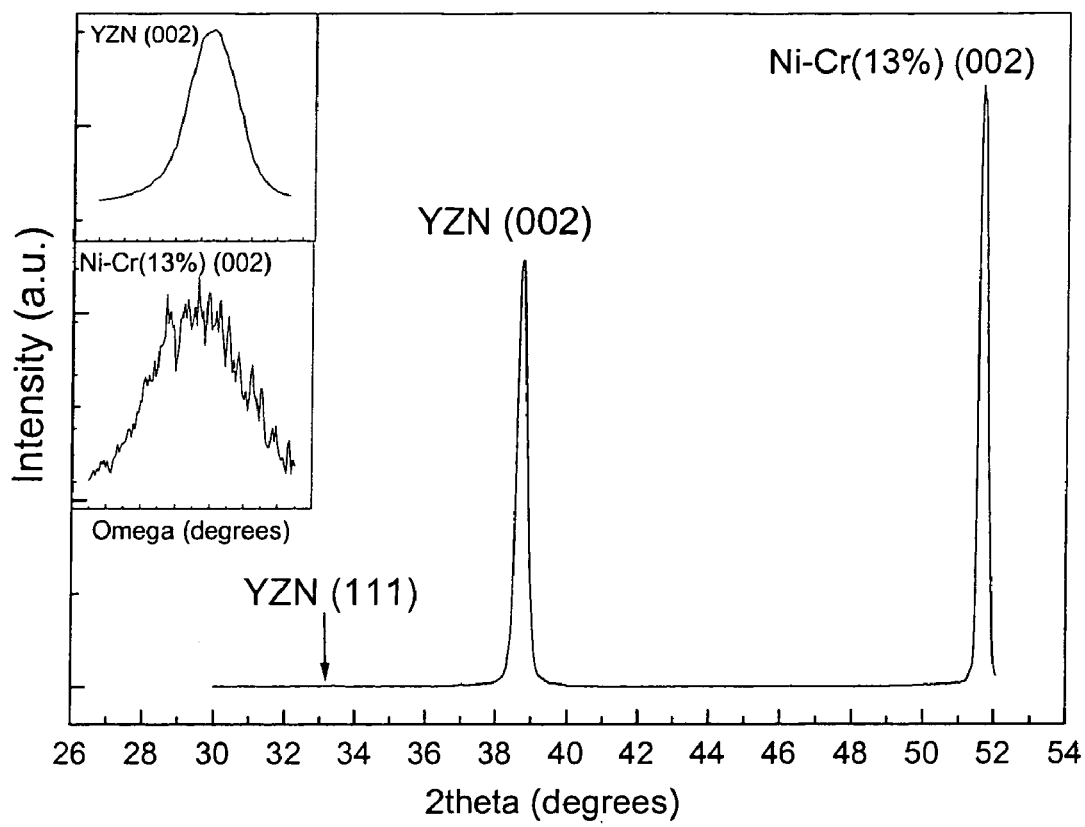
FIG. 25 shows a XRD θ-2θ scan from a YZN film grown on Ni—Cr (13%) (001) using high-rate reactive sputtering, showing only (002) reflections.
Figure 26:
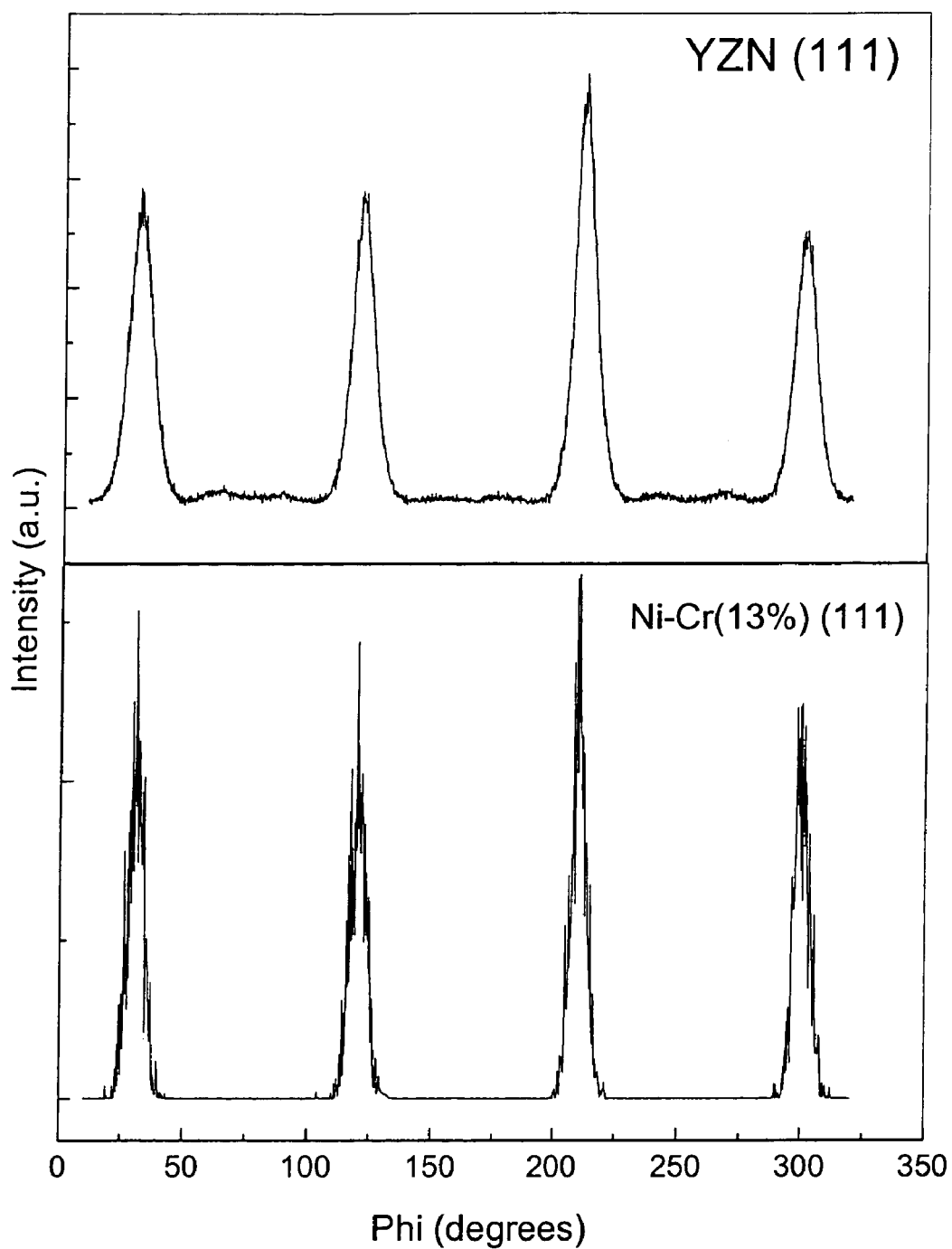
FIG. 26 compares the phi-scan from (a) YZN (111) and (b) Ni—Cr (13%) (111). The FWHM of the phi-scan peaks were ~10.6° and ~7.2° for YZN and Ni, respectively. Only a single orientation, corresponding to the cube-on-cube epitaxy of YZN on the biaxially textured Ni is evident.

Magnetron sputtered $(Zr_{0.8}Y_{0.2})N$ (YZN) films were grown on a biaxially textured Ni substrate, using a two-temperature technique of this invention. Initially growth was done at 570° C. until the YZN thickness reached ~40 nm. The growth temperature was then raised to 810° C. and maintained thereat for the remainder of the deposition. Total film thickness was ~200 nm, achieved at a deposition rate of 1.2 Angstrom/sec. The films showed good in-plane and out-of-plane alignment. FIG. 25 shows a XRD θ-2θ scan, and FIG. 26 shows the (111) phi scan. The existence of only four peaks demonstrates a single epitaxial orientation. The location of the peaks in the (111) pole figure is consistent with a cube-on-cube epitaxial relationship. The YZN (111) phi scan showed a full-width-half-maximum (FWHM) obtained by fitting a gaussian curve to the data to be 10.6°. The FWHM of the underlying Ni was FWHM ~7.2°. The rocking curves FWHM (the out-of-plane texture) of the YZN layer shown in inset of FIG. 25 was to be 4.2° and 5.8° in and about rolling direction. This is almost 2° sharper than the underlying Ni substrate, 6.4° and 7.5° in and about rolling direction, respectively.

Example 18

Figure 27:
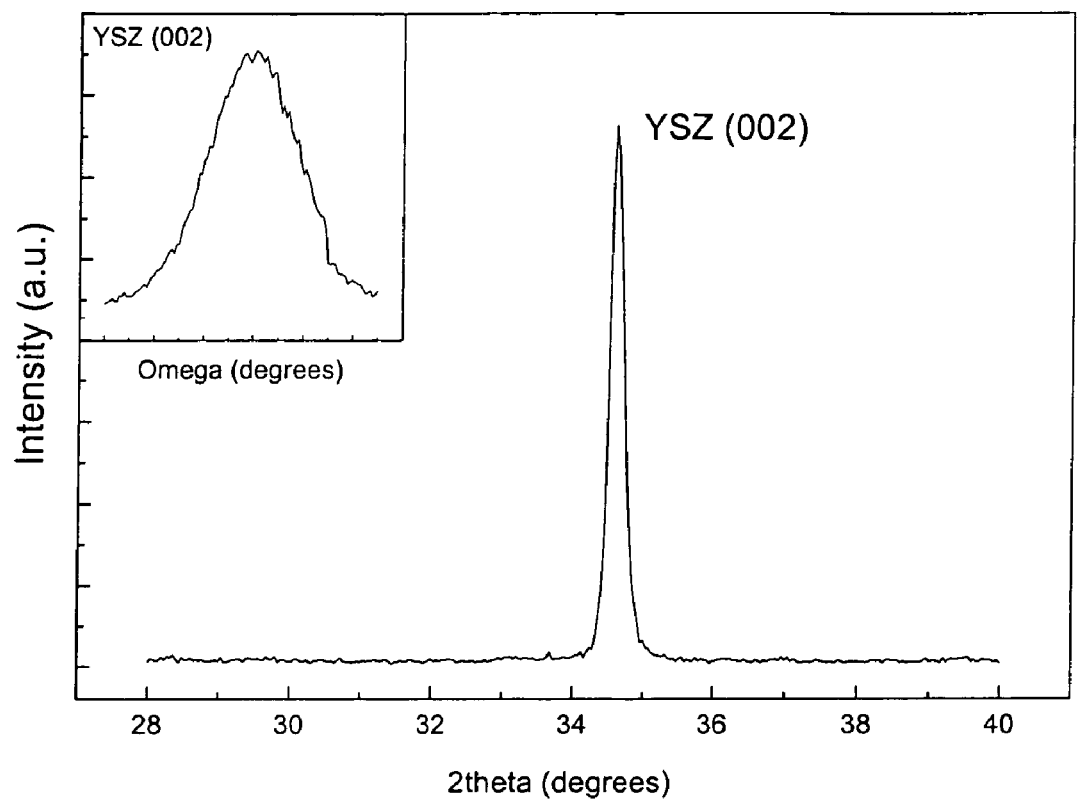
FIG. 27 shows a θ-2θ scan from a YSZ film formed by oxidation of a YSZ film grown on Ni—Cr (13%) (001) using high-rate reactive sputtering, showing only (002) reflections. Inset in FIG. 27 also compares the rocking curve from YSZ (200) and Ni—Cr (13%) (200), showing the FWHM of 4.8°. FWHM of YSZ is 1.9° smaller than that of Ni—Cr, indicating out-of-plane texture and smooth surface morphology better than that of Ni.
Figure 28:
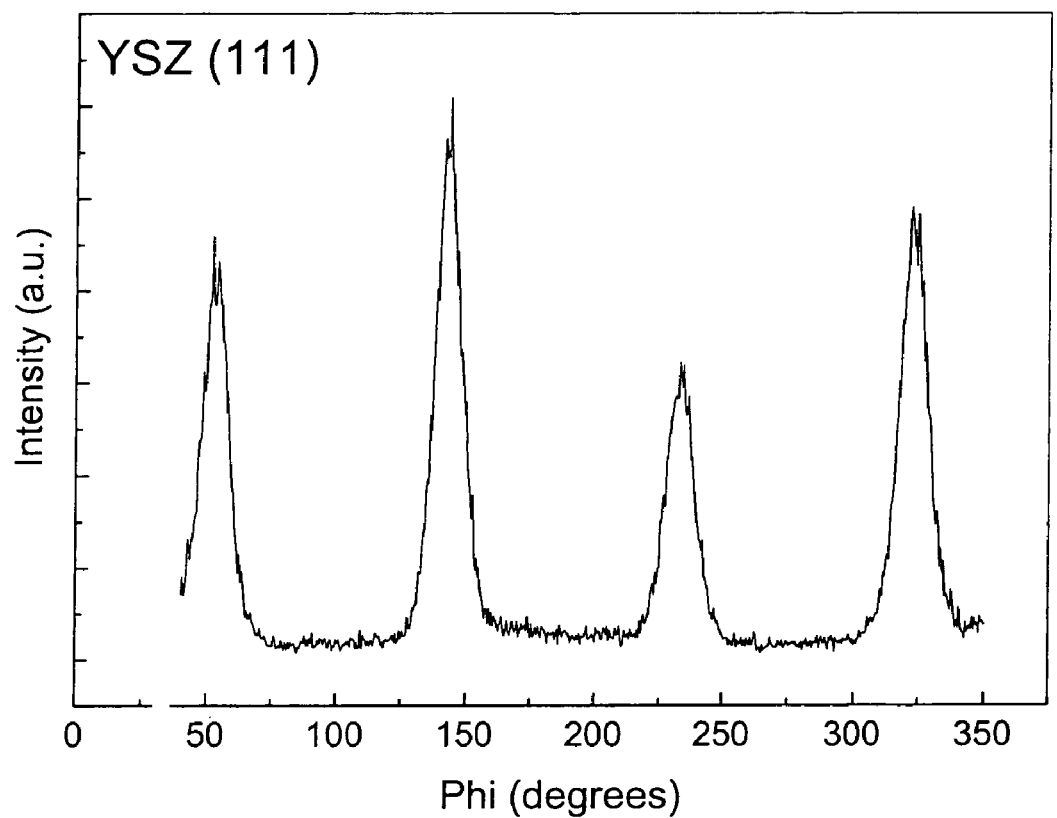
FIG. 28 compares the phi-scan from YSZ (111). The FWHM of the phi-scan peaks were ~11.8° and ~7.2°. Only a single orientation, corresponding to the cube-on-cube epitaxy of YSZ on the biaxially textured Ni is evident.

Oxidation of the YZN films deposited on a Ni—Cr (13 wt. % chromium) alloy substrate was carried out in a tube furnace in hydrogen-water vapor mixtures. The temperatures ranged from 700 to 750° C., and the annealing time was 10 minute. The films showed in-plane and out-of-plane alignment comparable to the YZN source material. FIG. 27 shows a XRD θ-2θ scan, and FIG. 28 shows the (111) phi scan. The existence of only four peaks demonstrates a single epitaxial orientation. The location of the peaks in the (111) pole figure is consistent with a cube-on-cube epitaxial relationship. The YZN (111) phis scan showed a full-width-half-maximum (FWHM) obtained by fitting a Gaussian curve to the data to be 11.8°. The FWHM of the rocking curves (the out-of-plane texture) of the YSZ layer was found to be 4.6° in rolling direction. This is ~2° sharper than the underlying Ni substrate 6.7°. This is the first example of epitaxial YSZ fabricated on a Ni—Cr alloy substrate without pre-deposition of Ni prior to the oxide buffer—possible because unlike typical oxide deposition, precursor oxidation proceeds from the surface. The oxidation condition and annealing time were chosen so that nitride is oxidized without substantial oxidation of the Cr component in the substrate. Ease of nitride growth and subsequent oxidation without Ni pre-deposition on Ni—Cr alloy substrates demonstrates just one substantial advantage of this invention over conventional buffer processing.

Example 19

Figure 29:
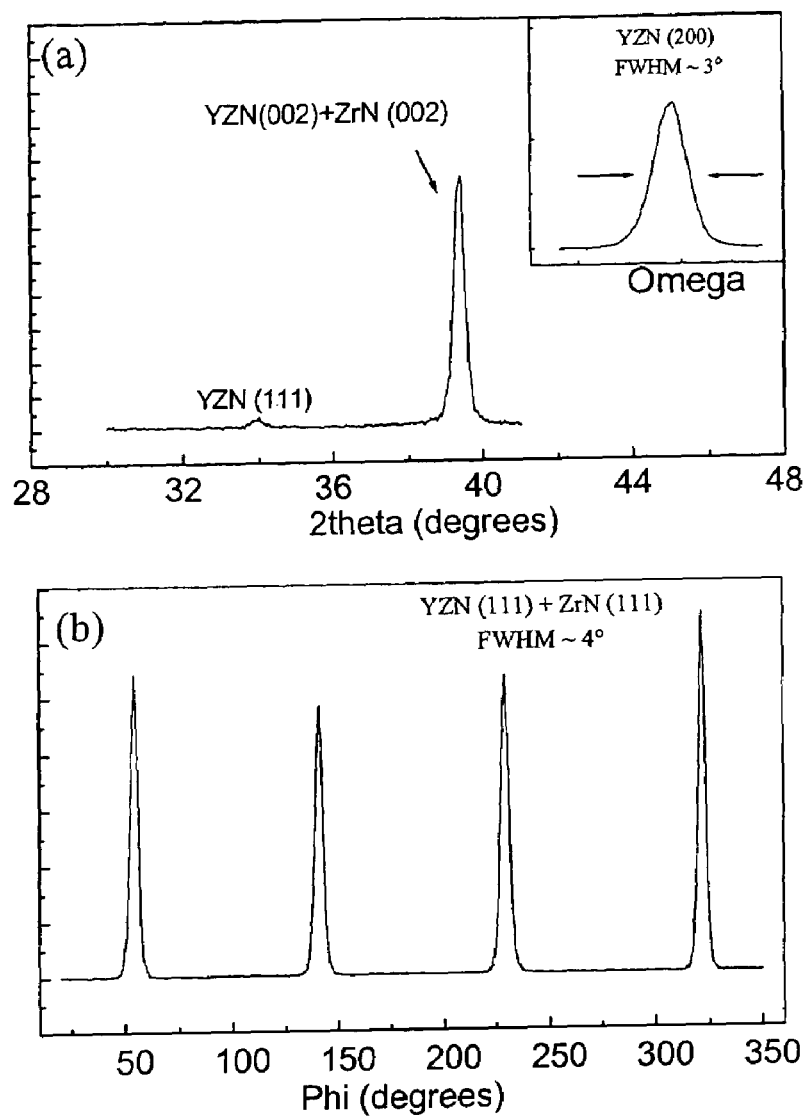
FIG. 29(a) provides θ-2θ x-ray diffraction (XRD) scan of a typical YZN (40 nm)/ZrN (20 nm)/Si (001) structure. Inset shows a rocking curve of nitride (002); (b) The off-axis phi scans of the nitride (111).

Improvement in epitaxial quality of YZN on Si (001) substrate was observed for a thin YZN films, when a thin ZrN buffer layer was first deposited prior to YZN. FIG. 29(a) shows a θ-2θ x-ray diffraction (XRD) scan of a typical YZN (30 nm)/ZrN (20 nm)/Si (001) structure, showing intense nitride (002) peak. Intensity of (111) peak is minimal, indicating a good out-of-orientation texture. Inset shows rocking curve on Nitride (002) peak, showing typical FWHM of rocking curve scan ~3°. The off-axis Phi scans of the nitride (111) in FIG. 10(b) shows FWHM of ~4°.

Example 20

Figure 30:
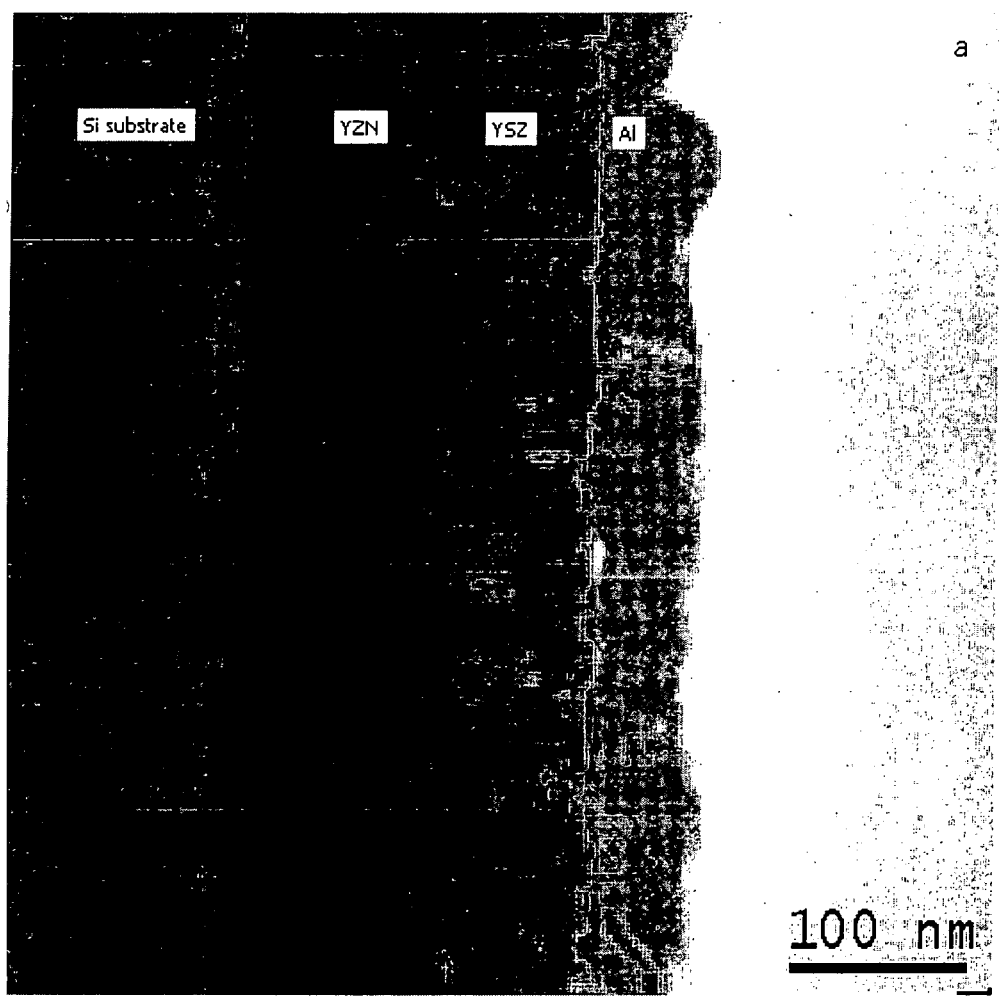
FIG. 30 shows a cross-sectional TEM micrograph of a grown Si/YZN/YSZ sample.
Figure 31:
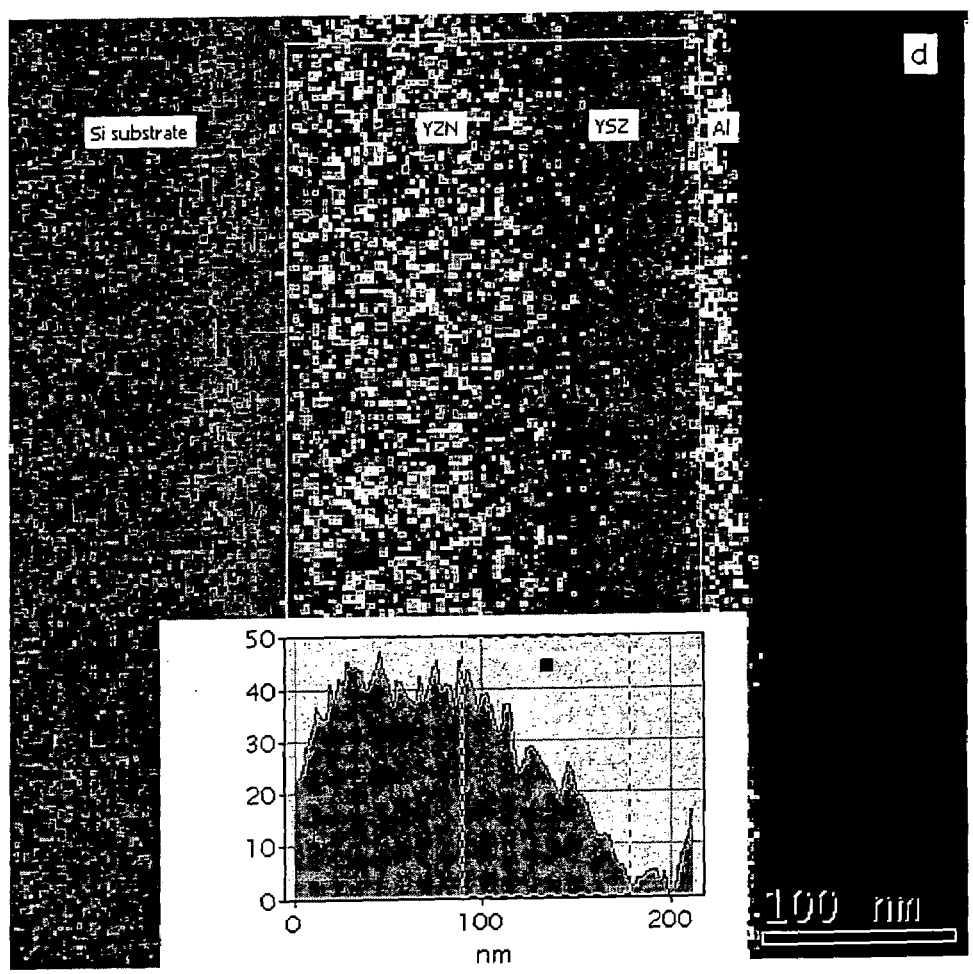
FIG. 31 provides a nitrogen map from the same area as FIG. 30. Inset shows integrated intensity profile across the interface.

The underlying mechanism for epitaxial YSZ formation by oxidation of YZN is believed due, at least in part, to the cooperative exchange of nitrogen and oxygen. As the YSZ layer begins to form from the upper surface (in the process consuming YZN) it is thought oxygen diffuses in and nitrogen diffuses out through the lattice. To confirm such a mechanism for nitrogen transport through the YSZ lattice, $N_2$ content analysis was done on a partially-oxidized YSZ/YZN/Si by high resolution TEM (FIG. 30). Nitrogen distribution can be seen with GIF elemental mapping (FIG. 31). Brighter area in the maps shows higher concentration of nitrogen. Integrated intensity profile across the interface shows the N distribution much clearer (inset in FIG. 31). The transition area is shown by brown squares in the intensity profiles. The thickness of the transmission area in the deposited sample is less than 17 nm. The small thickness of transmission area confirms sharp interface between YZN and YSZ. Furthermore uniform distribution of nitrogen in YSZ indicates that nitrogen removal during the oxidation occurs at least partially through lattice diffusion through YSZ.

While the principles of this invention have been described in connection with specific embodiments, it should be understood clearly that the descriptions, along with the chosen figures, tables, and data therein, are made only by way of example and are not intended to limit the scope of this invention in any manner. For example, a variety of nitride thin films can be deposited epitaxially on a variety of suitable substrates, in particular those used in the preparation of various superconducting devices. Likewise, a variety of conversion/oxidation conditions and parameters can be employed, as would be understood from the present invention with a straight-forward extension thereof, as would be known by those individuals skilled in the art and made aware of this invention.

Epitaxial YSZ films on silicon, sapphire and other substrates are also used as templates for growth of other oxide films. For example, YSZ-buffered silicon substrates are used to grow YBCO-based superconductor films to fabricate Josephson junctions and SQUIDS, ferroelectric heterostructures to fabricate next-generation DRAMS, and ceramic-based magnetoresistant films as read heads for ultra high density magnetic information storage devices. The ability to deposit epitaxial YZN at high rates using reactive sputtering and subsequent to epitaxial YSZ is also suitable for the aforementioned applications. Growth of good quality YZN directly on silicon is preferable to growth of YSZ where silica formation may interfere with epitaxy growth.

Other advantages and features of this invention will become apparent from the claims made thereto, with the scope thereof determined by the reasonable equivalents, as would be understood by those skilled in the art.

What is claimed is:

1. A method of preparing an oxide film, said method comprising: providing a nickel substrate material having a surface; placing a nitride composition layer on said substrate surface, said nitride composition selected from the group consisting of transition and rare earth metal compounds and combinations thereof; and oxidizing said nitride composition.

2. The method of claim 1 wherein said nitride composition is annealed under oxidizing conditions.

3. The method of claim 2 wherein said conversion is at a time and temperature sufficient to provide complete oxidation of said nitride layer.

4. The method of claim 2 where said conversion is under oxygen partial pressures of less than about $10^{-6}$ atmosphere.

5. The method of claim 1 wherein at least one of water, ozone, peroxide, or metal-organic oxygen sources are used to oxidize said nitride composition.

6. The method of claim 1 wherein said nitride composition is oxidized in situ after deposition on said substrate.

7. The method of claim 1 wherein said nitride composition is zirconium nitride further including a molar percentage of yttrium nitride.

8. The method of claim 1 wherein said substrate has a plurality of nitride layers thereon and at least one said layer is oxidized.

9. The method of claim 8 wherein at least one said nitride layer is oxidized in situ after deposition on said substrate, and another nitride layer is oxidized ex situ.

10. The method of claim 1 wherein said nitride is a zirconium nitride composition.

11. The method of claim 10 wherein said nitride composition further includes a solute.

12. The method of claim 11 wherein said nitride composition is oxidized ex situ to provide a first oxide film.

13. The method of claim 12, further including direct deposition of a second oxide film on said first oxide film.

14. The method of claim 1 wherein said nitride composition layer is placed on said substrate over a temperature range.

15. The method of claim 1 wherein said substrate material comprises a nickel alloy.

16. The method of claim 15 wherein said substrate material is a nickel-chromium alloy.

* * * * *